United States Patent
Yamazaki et al.

(10) Patent No.: US 9,123,632 B2
(45) Date of Patent: Sep. 1, 2015

(54) SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP); Atsuo Isobe, Isehara (JP); Toshinari Sasaki, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 239 days.

(21) Appl. No.: 13/626,346

(22) Filed: Sep. 25, 2012

(65) Prior Publication Data

US 2013/0082254 A1    Apr. 4, 2013

(30) Foreign Application Priority Data

Sep. 30, 2011 (JP) .................................. 2011-217872

(51) Int. Cl.
*H01L 29/10* (2006.01)
*H01L 29/20* (2006.01)
(Continued)

(52) U.S. Cl.
CPC .......... *H01L 29/20* (2013.01); *H01L 29/41733* (2013.01); *H01L 29/45* (2013.01); *H01L 29/7869* (2013.01)

(58) Field of Classification Search
CPC .................................. H01L 29/786–29/78696
See application file for complete search history.

(56) References Cited

U.S. PATENT DOCUMENTS 5,731,856 A    3/1998  Kim et al.
5,744,864 A    4/1998  Cillessen et al.
(Continued)

FOREIGN PATENT DOCUMENTS

EP    1737044 A    12/2006
EP    2226847 A    9/2010
(Continued)

OTHER PUBLICATIONS

Fortunato.E et al., "Wide-Bandgap High-Mobility Zno Thin-Film Transistors Produced at Room Temperature,", Appl. Phys. Lett. (Applied Physics Letters) , Sep. 27, 2004, vol. 85, No. 13, pp. 2541-2543.
(Continued)

*Primary Examiner* — Matthew W Such
*Assistant Examiner* — Ali Naraghi
(74) *Attorney, Agent, or Firm* — Eric J. Robinson; Robinson Intellectual Property Law Office, P.C.

(57) ABSTRACT

A highly reliable structure is provided when high-speed driving of a semiconductor device is achieved by improving on-state characteristics of the transistor. The on-state characteristics of the transistor are improved as follows: an end portion of a source electrode and an end portion of a drain electrode overlap with end portions of a gate electrode, and the gate electrode surely overlaps with a region serving as a channel formation region of an oxide semiconductor layer. Further, embedded conductive layers are formed in an insulating layer so that large contact areas are obtained between the embedded conductive layers and the source and drain electrodes; thus, the contact resistance of the transistor can be reduced. Prevention of coverage failure with a gate insulating layer enables the oxide semiconductor layer to be thin; thus, the transistor is miniaturized.

14 Claims, 12 Drawing Sheets

(51) Int. Cl.
*H01L 29/417* (2006.01)
*H01L 29/45* (2006.01)
*H01L 29/786* (2006.01)

(56) References Cited

U.S. PATENT DOCUMENTS

| | | | |
|---|---|---|---|
| 5,972,769 A * | 10/1999 | Tsu et al. | 438/396 |
| 6,294,274 B1 | 9/2001 | Kawazoe et al. | |
| 6,489,197 B2 * | 12/2002 | Uchiyama | 438/253 |
| 6,563,174 B2 | 5/2003 | Kawasaki et al. | |
| 6,727,522 B1 | 4/2004 | Kawasaki et al. | |
| 7,045,861 B2 | 5/2006 | Takayama et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,084,428 B2 | 8/2006 | Yudasaka et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,576,394 B2 | 8/2009 | Furuta et al. | |
| 7,674,650 B2 | 3/2010 | Akimoto et al. | |
| 7,732,819 B2 | 6/2010 | Akimoto et al. | |
| 7,791,072 B2 | 9/2010 | Kumomi et al. | |
| 7,795,620 B2 * | 9/2010 | Huang | 257/68 |
| 7,902,584 B2 * | 3/2011 | Nakajima | 257/308 |
| 7,935,967 B2 | 5/2011 | Takayama et al. | |
| 7,981,734 B2 | 7/2011 | Furuta et al. | |
| 8,158,500 B2 * | 4/2012 | Anderson et al. | 438/585 |
| 8,217,435 B2 * | 7/2012 | Chang et al. | 257/288 |
| 8,232,588 B2 * | 7/2012 | Doyle et al. | 257/308 |
| 8,237,166 B2 | 8/2012 | Kumomi et al. | |
| 8,253,252 B2 | 8/2012 | Shingu et al. | |
| 8,633,480 B2 | 1/2014 | Yamazaki et al. | |
| 8,765,522 B2 | 7/2014 | Yamazaki | |
| 8,828,864 B2 * | 9/2014 | Yun | 438/629 |
| 8,907,336 B2 | 12/2014 | Shieh et al. | |
| 8,916,918 B2 * | 12/2014 | Nishi et al. | 257/296 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0036095 A1 * | 2/2004 | Brown et al. | 257/296 |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0059742 A1 | 3/2010 | Shieh et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0207179 A1 * | 8/2010 | Booth et al. | 257/296 |
| 2011/0227074 A1 | 9/2011 | Kato et al. | |
| 2011/0263059 A1 | 10/2011 | Takayama et al. | |
| 2012/0235274 A1 * | 9/2012 | Doyle et al. | 257/516 |
| 2013/0075722 A1 | 3/2013 | Yamazaki et al. | |
| 2014/0131704 A1 | 5/2014 | Yamazaki et al. | |
| 2015/0115260 A1 | 4/2015 | Shieh et al. | |

FOREIGN PATENT DOCUMENTS

| | | | |
|---|---|---|---|
| JP | 60-198861 A | 10/1985 | |
| JP | 63-210022 A | 8/1988 | |
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 02-008821 A | 1/1990 | |
| JP | 04-324938 A | 11/1992 | |
| JP | 05-251705 A | 9/1993 | |
| JP | 08-264794 A | 10/1996 | |
| JP | 11-505377 | 5/1999 | |
| JP | 2000-044236 A | 2/2000 | |
| JP | 2000-150900 A | 5/2000 | |
| JP | 2002-076356 A | 3/2002 | |
| JP | 2002-289859 A | 10/2002 | |
| JP | 2003-086000 A | 3/2003 | |
| JP | 2003-086808 A | 3/2003 | |
| JP | 2004-103957 A | 4/2004 | |
| JP | 2004-186393 A | 7/2004 | |
| JP | 2004-273614 A | 9/2004 | |
| JP | 2004-273732 A | 9/2004 | |

(56) References Cited

FOREIGN PATENT DOCUMENTS

| JP | 2006-165528 | 6/2006 |
|---|---|---|
| JP | 2008-535205 | 8/2008 |
| JP | 2008-270773 A | 11/2008 |
| JP | 2011-119718 A | 6/2011 |
| JP | 2011-135064 A | 7/2011 |
| WO | WO-2004/114391 | 12/2004 |
| WO | WO-2007/089048 | 8/2007 |
| WO | WO-2010/028269 | 3/2010 |
| WO | WO-2011/055620 | 5/2011 |
| WO | WO-2011/065210 | 6/2011 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IgZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—ZnO system at 1350° C,", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)m$ (m= 3, 4, and 5), $InGaO_3(ZnO)_3$, and $Ga_2O_3(ZnO)m$ (m= 7, 8, 9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N. et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GiZO ($Ga_2O_3$—$In_2O_3$—ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IgZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates. D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

(56) References Cited

OTHER PUBLICATIONS

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", Nirim Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YBFE2O4, and YB2FE3O7 Types of Structures for Compounds in the In2O3 and Sc2O3—A2O3—BO Systems [A; Fe, Ga, Or, Al; B: Mg, Mn, Fe, Ni, Cu,Or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

* cited by examiner

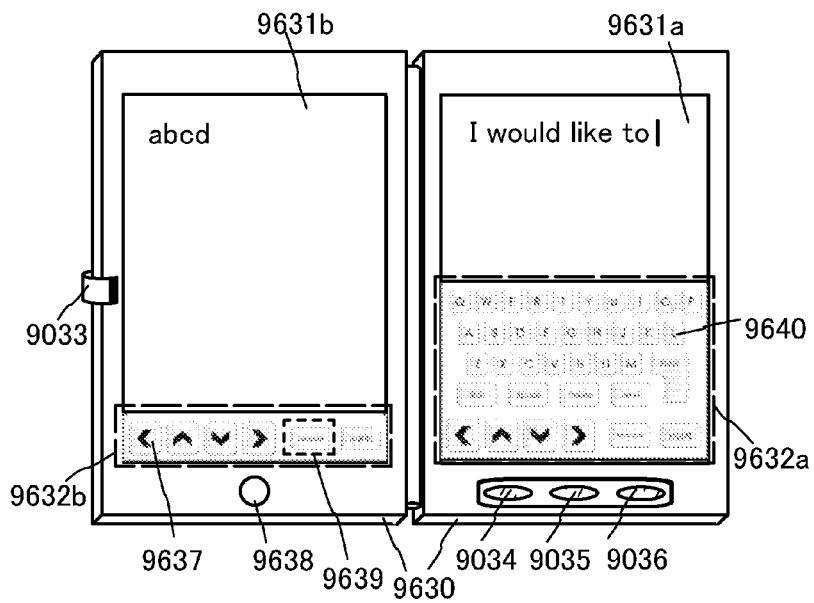
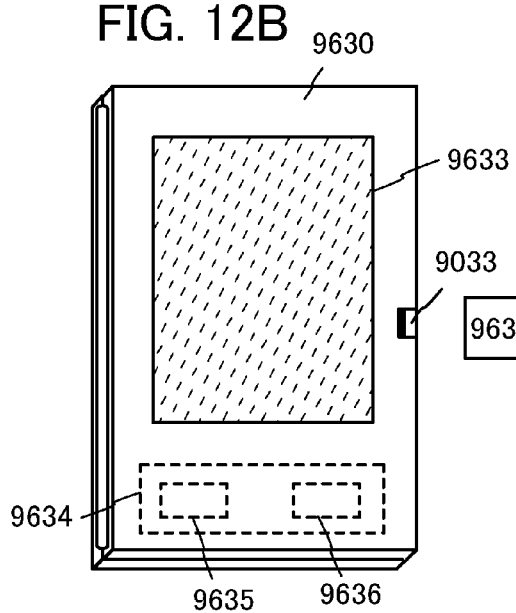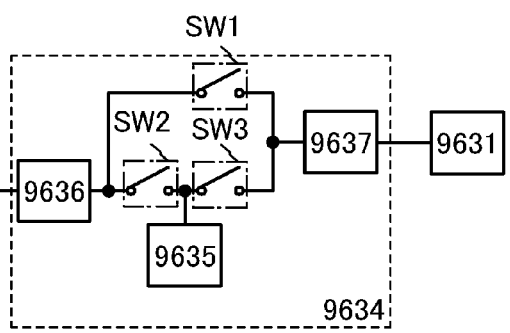

SEMICONDUCTOR DEVICE

BACKGROUND OF THE INVENTION

1. Field of the Invention

The present invention relates to a semiconductor device and a method for manufacturing the semiconductor device.

In this specification, a semiconductor device generally means a device which can function by utilizing semiconductor characteristics, and an electro-optic device, a semiconductor circuit, and an electronic device are all semiconductor devices.

2. Description of the Related Art

Attention has been focused on a technique for forming a transistor using a semiconductor thin film (also referred to as a thin film transistor (TFT)) formed over a substrate having an insulating surface. Such a transistor is applied to a wide range of electronic devices such as an integrated circuit (IC) or an image display device (display device). A silicon-based semiconductor material is widely known as a material for a semiconductor thin film applicable to the transistor. As another material, an oxide semiconductor has been attracting attention.

For example, a top-gate coplanar transistor whose semiconductor layer is formed using an amorphous oxide containing indium (In), gallium (Ga), and zinc (Zn) is disclosed (see Patent Document 1).

REFERENCE

[Patent Document 1] Japanese Published Patent Application No. 2006-165528

SUMMARY OF THE INVENTION

A structure in which a gate electrode surely overlaps with a region serving as a channel formation region of a semiconductor layer is preferable in order to improve on-state characteristics (e.g., on-state current or field-effect mobility) of a transistor to achieve high-speed driving of a semiconductor device. According to the structure, gate voltage can be surely applied to the channel formation region between a source electrode and a drain electrode of the transistor, whereby the resistance between the source electrode and the drain electrode can be reduced.

In a coplanar transistor in which a source electrode and a drain electrode are provided spaced from each other with a gate electrode provided therebetween, there exists a space between the gate electrode and each of the source electrode and the drain electrode when seen in the top plane or the cross section. That space behaves as a resistor in operating the transistor.

Thus, in the case of using a silicon-based semiconductor material, an impurity is added to a semiconductor region in that space to reduce the resistance of the region in that space, whereby the gate electrode surely overlaps with a region serving as a channel formation region of a semiconductor layer, leading to improvement in on-state characteristics. On the other hand, in the case of using an oxide semiconductor as a semiconductor material, a structure in which, in a region serving as a channel formation region of a semiconductor layer, an end portion of the source electrode and an end portion of the drain electrode are aligned with or overlap with end portions of the gate electrode is preferable to reduce the resistance of the region in that space.

However, such a structure of the transistor in which an end portion of the source electrode and an end portion of the drain electrode are aligned with or overlap with end portions of the gate electrode has a problem of a short circuit between the gate electrode and the source electrode or the drain electrode. This short circuit between the electrodes is attributed to coverage failure with a gate insulating layer. In particular, a problem of such coverage failure arises when the gate insulating layer is thinned for miniaturization of the transistor.

Coverage failure or the like with the gate insulating layer provided over the source electrode, the drain electrode, and the oxide semiconductor layer is likely to cause a short circuit particularly in a region which is in contact with a channel formation region of the oxide semiconductor layer. In many cases, the source electrode and the drain electrode are provided to be thicker than the gate insulating layer in order to improve the on-state characteristics. Therefore, when the gate insulating layer is formed to be thin, the coverage failure further increases owing to the thick source and drain electrodes; consequently, a short circuit is more likely to occur between the electrodes, leading to a decrease in reliability.

In view of the above, an object of one embodiment of the present invention is to provide a highly reliable structure when high-speed driving of a semiconductor device is achieved by improving on-state characteristics of the transistor.

An end portion of a source electrode and an end portion of a drain electrode overlap with a gate electrode, and the gate electrode surely overlaps with a region serving as a channel formation region of a semiconductor layer. Further, embedded conductive layers are provided in an insulating layer, and conductive layers functioning as the source electrode and the drain electrode are provided in contact with the embedded conductive layers; thus, the contact areas between the embedded conductive layers and the source and drain electrodes are increased. With this structure, the contact resistance of the transistor is reduced and on-state characteristics thereof are improved.

One embodiment of the present invention is a semiconductor device including an insulating layer; a first embedded conductive layer and a second embedded conductive layer each of which is embedded in the insulating layer and has an top surface that is exposed from the insulating layer; a first conductive layer provided partly in contact with a top surface of the insulating layer between the first embedded conductive layer and the second embedded conductive layer and in contact with the exposed top surface of the first embedded conductive layer; a second conductive layer provided partly in contact with the top surface of the insulating layer between the first embedded conductive layer and the second embedded conductive layer and in contact with the exposed top surface of the second embedded conductive layer; a third conductive layer provided partly in contact with the first conductive layer and the exposed top surface of the first embedded conductive layer; a fourth conductive layer provided partly in contact with the second conductive layer and the exposed top surface of the second embedded conductive layer; an oxide semiconductor layer provided over the first conductive layer, the second conductive layer, the third conductive layer, and the fourth conductive layer and partly in contact with the top surface of the insulating layer between the first embedded conductive layer and the second embedded conductive layer; a gate insulating layer provided over the oxide semiconductor layer; and a gate electrode provided partly in contact with a top surface of the gate insulating layer. The gate electrode partly overlaps with the first conductive layer with the oxide semiconductor layer and the gate insulating layer interposed therebetween. Further, the gate electrode partly overlaps with the second conductive layer with the oxide semiconductor layer and the gate insulating layer interposed therebetween. Furthermore, the gate electrode partly overlaps with the top surface of the insulating layer between the first embedded conductive layer and the second embedded conductive layer with the oxide semiconductor layer and the gate insulating layer interposed between the gate electrode and the insulating layer.

In the above semiconductor device, the gate electrode is provided between an end portion of the third conductive layer formed to partly cover the first conductive layer and an end portion of the fourth conductive layer formed to partly cover the second conductive layer, with the oxide semiconductor layer and the gate insulating layer interposed between the gate electrode and the end portions of the third conductive layer and the fourth conductive layer, and the gate electrode is spaced from each of the end portions of the third conductive layer and the fourth conductive layer.

Another embodiment of the present invention is a semiconductor device including an insulating layer; a first embedded conductive layer and a second embedded conductive layer each of which is embedded in the insulating layer and has an exposed top surface that is exposed from the insulating layer; a first conductive layer provided partly in contact with a top surface of the insulating layer between the first embedded conductive layer and the second embedded conductive layer and partly in contact with the exposed top surface of the first embedded conductive layer; a second conductive layer provided partly in contact with the top surface of the insulating layer between the first embedded conductive layer and the second embedded conductive layer and partly in contact with the exposed top surface of the second embedded conductive layer; a third conductive layer provided partly in contact with the exposed top surface of the first embedded conductive layer; a fourth conductive layer provided partly in contact with the exposed top surface of the second embedded conductive layer; a fifth conductive layer provided partly in contact with the first conductive layer and the third conductive layer and partly in contact with, through a first opening between the first conductive layer and the third conductive layer, the exposed top surface of the first embedded conductive layer; a sixth conductive layer provided partly in contact with the second conductive layer and the fourth conductive layer and partly in contact with, through a second opening between the second conductive layer and the fourth conductive layer, the exposed top surface of the second embedded conductive layer; an oxide semiconductor layer provided over the first conductive layer, the second conductive layer, the third conductive layer, the fourth conductive layer, the fifth conductive layer, and the sixth conductive layer and partly in contact with the top surface of the insulating layer between the first embedded conductive layer and the second embedded conductive layer; a gate insulating layer provided over the oxide semiconductor layer; and a gate electrode provided partly in contact with a top surface of the gate insulating layer. The gate electrode partly overlaps with the first conductive layer with the oxide semiconductor layer and the gate insulating layer interposed therebetween. Further, the gate electrode partly overlaps with the second conductive layer with the oxide semiconductor layer and the gate insulating layer interposed therebetween. Furthermore, the gate electrode partly overlaps with the top surface of the insulating layer between the first embedded conductive layer and the second embedded conductive layer with the oxide semiconductor layer and the gate insulating layer interposed between the gate electrode and the insulating layer.

In the above semiconductor device, the gate electrode is provided between an end portion of the fifth conductive layer formed to partly cover the first conductive layer and an end portion of the sixth conductive layer formed to partly cover the second conductive layer, with the oxide semiconductor layer and the gate insulating layer interposed between the gate electrode and the end portions of the fifth conductive layer and the sixth conductive layer, and the gate electrode is spaced from each of the end portions of the fifth conductive layer and the sixth conductive layer.

Another embodiment of the present invention is a semiconductor device including an insulating layer; a first embedded conductive layer and a second embedded conductive layer each of which is embedded in the insulating layer and has an exposed top surface that is exposed from the insulating layer; a first conductive layer provided partly in contact with a top surface of the insulating layer between the first embedded conductive layer and the second embedded conductive layer and in contact with the exposed top surface of the first embedded conductive layer; a second conductive layer provided partly in contact with the top surface of the insulating layer between the first embedded conductive layer and the second embedded conductive layer and in contact with the exposed top surface of the second embedded conductive layer; a first oxide semiconductor layer provided partly in contact with the first conductive layer and the exposed top surface of the first embedded conductive layer; a second oxide semiconductor layer provided partly in contact with the second conductive layer and the exposed top surface of the second embedded conductive layer; a third oxide semiconductor layer provided over the first conductive layer, the second conductive layer, the first oxide semiconductor layer, and the second oxide semiconductor layer and partly in contact with the top surface of the insulating layer between the first embedded conductive layer and the second embedded conductive layer; a gate insulating layer provided over the third oxide semiconductor layer; and a gate electrode provided partly in contact with a top surface of the gate insulating layer. The gate electrode partly overlaps with the first conductive layer with the third oxide semiconductor layer and the gate insulating layer interposed therebetween. Further, the gate electrode partly overlaps with the second conductive layer with the third oxide semiconductor layer and the gate insulating layer interposed therebetween. Furthermore, the gate electrode partly overlaps with the top surface of the insulating layer between the first embedded conductive layer and the second embedded conductive layer with the third oxide semiconductor layer and the gate insulating layer interposed between the gate electrode and the insulating layer.

Another embodiment of the present invention is a semiconductor device including an insulating layer; a first embedded conductive layer and a second embedded conductive layer each of which is embedded in the insulating layer and has an exposed top surface that is exposed from the insulating layer; a first conductive layer provided partly in contact with a top surface of the insulating layer between the first embedded conductive layer and the second embedded conductive layer and partly in contact with the exposed top surface of the first embedded conductive layer; a second conductive layer provided partly in contact with the top surface of the insulating layer between the first embedded conductive layer and the second embedded conductive layer and partly in contact with the exposed top surface of the second embedded conductive layer; a third conductive layer provided partly in contact with the exposed top surface of the first embedded conductive layer; a fourth conductive layer provided partly in contact with the exposed top surface of the second embedded conductive layer; a first oxide semiconductor layer provided partly in contact with the first conductive layer and the third conductive layer and partly in contact with, through a first opening between the first conductive layer and the third conductive layer, the exposed top surface of the first embedded conductive layer; a second oxide semiconductor layer provided partly in contact with the second conductive layer and the fourth conductive layer and partly in contact with, through a second opening between the second conductive layer and the fourth conductive layer, the exposed top surface of the second embedded conductive layer; a third oxide semiconductor layer provided over the first conductive layer, the second conductive layer, the third conductive layer, the fourth conductive layer, the first oxide semiconductor layer, and the second oxide semiconductor layer and partly in contact with the top surface of the insulating layer between the first embedded conductive layer and the second embedded conductive layer; a gate insulating layer provided over the third oxide semiconductor layer; and a gate electrode provided partly in contact with a top surface of the gate insulating layer. The gate electrode partly overlaps with the first conductive layer with the third oxide semiconductor layer and the gate insulating layer interposed therebetween. Further, the gate electrode partly overlaps with the second conductive layer with the third oxide semiconductor layer and the gate insulating layer interposed therebetween. Furthermore, the gate electrode partly overlaps with the top surface of the insulating layer between the first embedded conductive layer and the second embedded conductive layer with the third oxide semiconductor layer and the gate insulating layer interposed between the gate electrode and the insulating layer.

In the above embodiment, the first conductive layer and the second conductive layer may each have a thickness greater than or equal to 5 nm and less than or equal to 20 nm.

In the semiconductor device of one embodiment of the present invention, the gate insulating layer preferably has a thickness greater than or equal to 10 nm and less than or equal to 20 nm.

In the semiconductor device of one embodiment of the present invention, the oxide semiconductor layer preferably has a thickness greater than or equal to 5 nm and less than or equal to 20 nm.

In the semiconductor device of one embodiment of the present invention, the oxide semiconductor layer preferably includes a c-axis aligned crystal.

In order to achieve a semiconductor device with higher performance, on-state characteristics of a transistor are improved as follows: an end portion of a source electrode and an end portion of a drain electrode overlap with a gate electrode, and the gate electrode surely overlaps with a region serving as a channel formation region of a semiconductor layer. Further, embedded conductive layers are provided in an insulating layer, and the source electrode and the drain electrode are provided in contact with the embedded conductive layers; thus, the contact areas between the embedded conductive layers and the source and drain electrodes are increased. Accordingly, the contact resistance of the transistor is reduced.

BRIEF DESCRIPTION OF THE DRAWINGS

In the accompanying drawings:

FIGS. 12A to 12C are diagrams illustrating one embodiment of an electronic device.

DETAILED DESCRIPTION OF THE INVENTION

Figure 1:
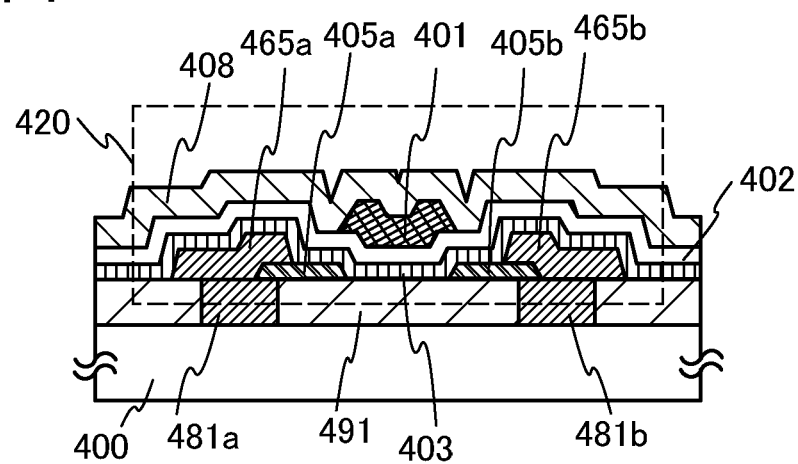
FIG. 1 is a diagram illustrating one embodiment of a semiconductor device.

Embodiments will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments. Note that, in the structures of the invention described below, the same portions or portions having similar functions are denoted by the same reference numerals in different drawings, and description of such portions is not repeated.

Note that the size, the thickness of a layer, and a region of each structure illustrated in the drawings and the like of the embodiments are exaggerated for simplicity in some cases. Therefore, embodiments of the present invention are not limited to such scales.

Note that, in this specification, the terms "first", "second", "third", to "N-th" (N is a natural number) are used in order to avoid confusion between components, and thus do not limit the components numerically.

(Embodiment 1)

In this embodiment, a semiconductor device of one embodiment of the invention disclosed herein and a method for manufacturing the semiconductor device are described with reference to FIG. 1, FIGS. 2A to 2D, and FIG. 3.

FIG. 1 is a cross-sectional view of a transistor 420 which is an example of a structure of a semiconductor device. Note that the transistor 420 has a single-gate structure in which one channel formation region is formed, but may have a double-gate structure in which two channel formation regions are formed or a triple-gate structure in which three channel formation regions are formed.

The transistor 420 includes, over a substrate 400 having an insulating surface, an insulating layer 491 provided with a first embedded conductive layer 481a and a second embedded conductive layer 481b, an oxide semiconductor layer 403, first conductive layers 405a and 405b, second conductive layers 465a and 465b, a gate insulating layer 402, a gate electrode 401, and an interlayer insulating layer 408 (see FIG. 1).

In the structure of FIG. 1 disclosed in this embodiment, the gate electrode 401 is provided to partly overlap with each of the first conductive layer 405a and the first conductive layer 405b with the oxide semiconductor layer 403 and the gate insulating layer 402 interposed between the gate electrode 401 and the first conductive layers 405a and 405b. Further, the gate electrode 401 is provided to partly overlap with a top surface of the insulating layer 491 between the first embedded conductive layer 481a and the second embedded conductive layer 481b with the oxide semiconductor layer 403 and the gate insulating layer 402 interposed between the gate electrode 401 and the insulating layer 491. That is, the gate electrode 401 is provided to overlap with a region serving as a channel formation region of the oxide semiconductor layer 403.

Note that the gate electrode 401 is provided between an end portion of the second conductive layer 465a which is formed to partly cover the first conductive layer 405a and an end portion of the second conductive layer 465b which is formed to partly cover the first conductive layer 405b, with the oxide semiconductor layer 403 and the gate insulating layer 402 interposed between the gate electrode 401 and the end portions of the second conductive layers 465a and 465b. Further, the gate electrode 401 is spaced from each of the end portions of the second conductive layers 465a and 465b.

Further, the first embedded conductive layer 481a is partly in contact with the first conductive layer 405a and the second conductive layer 465a. Similarly, the second embedded conductive layer 481b is partly in contact with the first conductive layer 405b and the second conductive layer 465b.

In the structure of FIG. 1 disclosed in this embodiment, the first embedded conductive layer 481a and the second embedded conductive layer 481b are provided in a lower portion of the transistor 420, which avoids the need to provide contact holes in the gate insulating layer 402 and the interlayer insulating layer 408. A large contact area can be obtained between the first embedded conductive layer 481a and a source electrode or a drain electrode, and a large contact area can be obtained between the second embedded conductive layer 481b and the source electrode or the drain electrode; thus, contact resistance can be reduced. In addition, the large contact area leads to a shorter distance between an end portion of the gate electrode 401 and each of the first embedded conductive layer 481a and the second embedded conductive layer 481b.

End portions of the first conductive layers 405a and 405b functioning as the source electrode and the drain electrode of the transistor 420 overlap with end portions of the gate electrode 401, and the gate electrode 401 surely overlaps with the region serving as the channel formation region of the oxide semiconductor layer 403; thus, on-state characteristics (e.g., on-state current or field effect mobility) of the transistor can be improved to achieve high-speed driving of a semiconductor device.

Further, in the structure of FIG. 1 disclosed in this embodiment, the first conductive layers 405a and 405b, which function as the source electrode and the drain electrode of the transistor, can be formed to be thin; therefore, the gate insulating layer 402 can be formed on a less stepped surface especially in the vicinity of the channel formation region of the oxide semiconductor layer 403. Accordingly, the gate insulating layer 402 can be formed with good coverage.

Further, since the first conductive layers 405a and 405b can be formed to be thin, the time taken to form the first conductive layers 405a and 405b by a process such as etching can be shortened.

Further, in the structure of FIG. 1 disclosed in this embodiment, the gate insulating layer 402 and the oxide semiconductor layer 403 can be thinned. Accordingly, the on-state characteristics can be improved, and the transistor can operate as a fully depleted transistor, which enables high integration, high-speed driving, and low power consumption.

In addition, since the end portions of the second conductive layers 465a and 465b functioning as the source electrode and the drain electrode of the transistor do not overlap with the end portions of the gate electrode 401 in the structure of FIG. 1 disclosed in this embodiment, an increase in the thickness of each of the second conductive layers 465a and 465b as compared with the thickness of each of the first conductive layers 405a and 405b does not lead to a short circuit between electrodes. Therefore, by increasing the thickness of each of the second conductive layers 465a and 465b, the source-drain current can be increased without causing a short circuit between electrodes.

As described above, in the structure of FIG. 1 disclosed in this embodiment, the end portions of the first conductive layers 405a and 405b overlap with the gate electrode 401, and the gate electrode 401 surely overlaps with the region serving as the channel formation region of the oxide semiconductor layer 403; thus, the on-state characteristics of the transistor can be improved. Moreover, by increasing the contact areas between the first and second embedded conductive layers 481a and 481b and the source and drain electrodes, contact resistance can be reduced.

Further, in the structure of FIG. 1 disclosed in this embodiment, coverage failure with the gate insulating layer 402 can be reduced, which enables the gate insulating layer 402 and the oxide semiconductor layer 403 to be thin. With this structure, the transistor 420 can be further miniaturized.

Next, FIGS. 2A to 2D illustrate an example of a method for manufacturing the transistor 420 illustrated in FIG. 1.

First, the insulating layer 491 is formed over the substrate 400 having an insulating surface.

There is no particular limitation on a substrate that can be used as the substrate 400 having an insulating surface as long as it has heat resistance high enough to withstand heat treatment performed later. For example, a glass substrate of barium borosilicate glass, aluminoborosilicate glass, or the like; a ceramic substrate; a quartz substrate; or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 400. Alternatively, any of these substrates provided with a semiconductor element may be used as the substrate 400.

The insulating layer 491 can be formed by a CVD method, a sputtering method, or the like. Note that the insulating layer 491 may have a single-layer structure or a stacked structure. Since the insulating layer 491 is to be in contact with the oxide semiconductor layer 403, the insulating layer 491 is preferably formed using an oxide containing a constituent similar to that of the oxide semiconductor layer 403. Specifically, the insulating layer 491 preferably includes an oxide of one or more elements selected from constituent elements of the oxide semiconductor layer 403, such as aluminum (Al), gallium (Ga), zirconium (Zr), and hafnium (Hf), and rare earth elements in the same group as aluminum, gallium, and the like. Among oxides of these elements, an oxide of aluminum, gallium, or a rare earth element, which is a Group 3 element, is further preferably used. As the rare earth element, scandium (Sc), yttrium (Y), cerium (Ce), samarium (Sm), or gadolinium (Gd) is preferably used. Such a material is compatible with the oxide semiconductor layer 403, and the use of such a material for the insulating layer 491 enables the state of an interface between the oxide semiconductor layer 403 and the insulating layer 491 to be favorable. Further, the crystallinity of the oxide semiconductor layer 403 can be improved.

Since the oxide semiconductor layer 403 is used as a semiconductor layer of the transistor 420, the energy gap of the insulating layer 491 is preferably larger than that of the oxide semiconductor layer 403.

Next, after the formation of the insulating layer 491, openings are provided therein and the first embedded conductive layer 481*a* and the second embedded conductive layer 481*b* are formed so that the openings are filled. Then a surface of the insulating layer 491 including the first embedded conductive layer 481*a* and the second embedded conductive layer 481*b* is polished by a CMP method.

For the first embedded conductive layer 481*a* and the second embedded conductive layer 481*b*, for example, a metal film containing an element selected from Al, Cr, Cu, Ta, Ti, Mo, and W or a metal nitride film containing any of the above elements as a component (e.g., a titanium nitride film, a molybdenum nitride film, or a tungsten nitride film) can be used.

In the case where a metal film of Al, Cu, or the like is used for the first embedded conductive layer 481*a* and the second embedded conductive layer 481*b*, a film of a high-melting-point metal such as Ti, Mo, or W or a metal nitride film thereof (e.g., a titanium nitride film, a molybdenum nitride film, or a tungsten nitride film) is preferably stacked on one or both of a bottom side and a top side of the metal film of Al, Cu, or the like.

Alternatively, the first embedded conductive layer 481*a* and the second embedded conductive layer 481*b* may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$, abbreviated to ITO), indium oxide-zinc oxide ($In_2O_3$—ZnO), or any of these metal oxide materials containing silicon oxide can be used.

Next, a first conductive layer is formed over the first embedded conductive layer 481*a*, the second embedded conductive layer 481*b*, and the insulating layer 491.

The first conductive layer is formed using a material that can withstand heat treatment performed later. As examples of a material used for the first conductive layer which is to function as a source electrode and a drain electrode, a metal film containing an element selected from Al, Cr, Cu, Ta, Ti, Mo, and W and a metal nitride film containing any of the above elements as a component (e.g., a titanium nitride film, a molybdenum nitride film, or a tungsten nitride film) can be given.

In the case where a metal film of Al, Cu, or the like is used for the first conductive layer, a film of a high-melting-point metal such as Ti, Mo, or W or a metal nitride film thereof (e.g., a titanium nitride film, a molybdenum nitride film, or a tungsten nitride film) is preferably stacked on one or both of a bottom side and a top side of the metal film of Al, Cu, or the like.

Alternatively, the first conductive layer may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$, abbreviated to ITO), indium oxide-zinc oxide ($In_2O_3$—ZnO), or any of these metal oxide materials containing silicon oxide can be used.

It is preferable that the first conductive layer be thinner than a second conductive layer 465 formed later. Specifically, it is preferable that the first conductive layer be as thin as possible to prevent coverage failure with the gate insulating layer 402 formed later; the first conductive layer may be formed to have a thickness greater than or equal to 1 nm and less than or equal to 30 nm (preferably greater than or equal to 10 nm and less than or equal to 20 nm).

Next, through a photolithography process, a resist mask is formed over the first conductive layer and etching treatment is performed partly thereon, so that the first conductive layers 405*a* and 405*b* (including a wiring formed using the same layer as the first conductive layer) are formed. Then the resist mask is removed. By the etching treatment, the first conductive layer is separated. The separated first conductive layers 405*a* and 405*b* function as the source electrode and the drain electrode of the transistor 420.

Next, the second conductive layer 465 is formed over the first conductive layers 405*a* and 405*b*.

The second conductive layer 465 is formed using a material that can withstand heat treatment performed later. As the second conductive layer 465, for example, a metal film containing an element selected from Al, Cr, Cu, Ta, Ti, Mo, and W or a metal nitride film containing any of the above elements as a component (e.g., a titanium nitride film, a molybdenum nitride film, or a tungsten nitride film) can be used.

Alternatively, a film of a high-melting-point metal such as Ti, Mo, or W or a metal nitride film thereof (e.g., a titanium nitride film, a molybdenum nitride film, or a tungsten nitride film) may be stacked on one or both of a bottom side and a top side of a metal film of Al, Cu, or the like.

Alternatively, the second conductive layer 465 may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$, abbreviated to ITO), indium oxide-zinc oxide ($In_2O_3$—ZnO), or any of these metal oxide materials containing silicon oxide can be used.

In the case where a single layer of a metal film of Al or Cu is used as the second conductive layer 465, it is preferable that a film of a high-melting-point metal such as Ti, Mo, or W or a metal nitride film thereof (e.g., a titanium nitride film, a molybdenum nitride film, or a tungsten nitride film) be used as the first conductive layer. With this structure, Al or Cu used for the second conductive layer 465 enables a reduction in wiring resistance, and an increase in resistance by oxidation of Al or Cu due to direct contact between the oxide semiconductor layer 403 and Al or Cu can be reduced. Further, it is preferable that a material whose etching selectivity relative to the second conductive layer 465 in etching in a later step is high be used for the first conductive layer.

It is preferable that the second conductive layer 465 be thicker than the first conductive layer. Specifically, the second conductive layer 465 can be formed to have any thickness equivalent to a thickness at which the wiring resistance of the second conductive layer 465 which is to function as the source electrode and the drain electrode is not large.

Figure 2A:
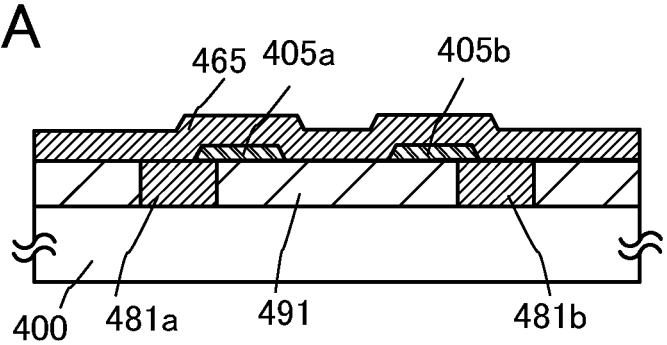
FIGS. 2A to 2D are diagrams illustrating one embodiment of a method for manufacturing a semiconductor device.

The foregoing is the description of the process to obtain the state illustrated in FIG. 2A.

Next, through a photolithography process, a resist mask is formed over the second conductive layer 465 and etching treatment is performed partly thereon, so that the second conductive layers 465*a* and 465*b* are formed. Then the resist mask is removed. By the etching treatment, the second conductive layer is separated.

Next, the oxide semiconductor layer 403 is formed over the first conductive layers 405*a* and 405*b*, the second conductive layers 465*a* and 465*b*, and the insulating layer 491.

In the formation of the oxide semiconductor layer 403, the concentration of hydrogen contained in the oxide semiconductor layer 403 is preferably reduced as much as possible. In order to reduce the hydrogen concentration, in the case where the oxide semiconductor layer 403 is formed by a sputtering method for example, a high-purity rare gas (typically argon), high-purity oxygen, or a high-purity mixed gas of a rare gas and oxygen from which impurities such as hydrogen, water, a hydroxyl group, and a hydride are removed is supplied as an atmosphere gas into a treatment chamber of a sputtering apparatus as appropriate.

Further, it is preferable that the oxide semiconductor layer 403 and the gate insulating layer 402 formed later be formed successively without exposure to the air. By successively forming the oxide semiconductor layer 403 and the gate insulating layer 402 without exposure to the air, adsorption of impurities such as hydrogen and moisture to the interface therebetween can be prevented.

In order to reduce the impurity concentration in the oxide semiconductor layer 403, it is also effective to form the oxide semiconductor layer 403 while the substrate 400 is kept at a high temperature. The temperature at which the substrate 400 is heated is higher than or equal to 150° C. and lower than or equal to 450° C.; the substrate temperature is preferably higher than or equal to 200° C. and lower than or equal to 350° C. The oxide semiconductor layer 403 can be made crystalline by heating the substrate 400 at a high temperature during the formation of the oxide semiconductor layer 403.

An oxide semiconductor used for the oxide semiconductor layer 403 preferably contains at least indium (In) or zinc (Zn). In particular, In and Zn are preferably contained. As a stabilizer for reducing variation in electric characteristics of a transistor formed using the oxide semiconductor, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid selected from lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide (also referred to as ITZO (registered trademark)), a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that, for example, an In—Ga—Zn-based oxide means an oxide containing In, Ga, and Zn, and there is no limitation on the ratio of In, Ga, and Zn. The In—Ga—Zn-based oxide may contain a metal element other than In, Ga, and Zn.

The oxide semiconductor layer 403 is preferably formed under a condition that much oxygen is contained (e.g., by a sputtering method in an atmosphere where the proportion of oxygen is 100%) so as to contain much oxygen (preferably include a region containing oxygen in excess of the stoichiometric composition of the oxide semiconductor in a crystalline state).

Further, it is preferable to use a high-purity gas from which impurities such as hydrogen, water, a hydroxyl group, and a hydride are removed as a sputtering gas used when the oxide semiconductor layer 403 is formed.

Note that a purified oxide semiconductor obtained by a reduction of impurities serving as electron donors (donors), such as moisture and hydrogen, and by a reduction of oxygen vacancies is an intrinsic (i-type) semiconductor or a substantially i-type semiconductor. Therefore, a transistor formed using the oxide semiconductor has significantly small off-state current. In addition, the band gap of the oxide semiconductor is 2 eV or more, preferably 2.5 eV or more, further preferably 3 eV or more. With the use of the oxide semiconductor layer which is highly purified by a sufficient reduction in the concentration of impurities such as moisture and hydrogen and a reduction of oxygen vacancies, the off-state current of the transistor can be reduced.

Unless otherwise specified, in the case of an n-channel transistor, off-state current in this specification is current which flows between a source terminal and a drain terminal when the potential of a gate is lower than or equal to 0 V with the potential of the source terminal as a reference potential while the potential of the drain terminal is higher than that of the source terminal and that of the gate.

Note that the oxide semiconductor can be in a single crystal state, a polycrystalline (also referred to as polycrystal) state, an amorphous state, or the like. In particular, it is preferable that the oxide semiconductor used for the oxide semiconductor layer 403 be a mixed layer including a crystal region and an amorphous region and be a crystalline oxide semiconductor.

In a crystalline oxide semiconductor, defects in the bulk can be further reduced and when surface flatness is improved, higher mobility can be obtained. In order to improve the surface flatness, the oxide semiconductor is preferably deposited on a flat surface. Specifically, the oxide semiconductor is preferably deposited on a surface with an average surface roughness ($R_a$) less than or equal to 1 nm, further preferably less than or equal to 0.3 nm, still further preferably less than or equal to 0.1 nm.

Note that $R_a$ is obtained by expanding, into three dimensions, arithmetic mean surface roughness that is defined by JIS B 0601:2001 (ISO4287:1997) so as to be applied to a curved surface. The $R_a$ can be expressed as an "average value of the absolute values of deviations from a reference surface to a specific surface" and is defined by the formula below.

$$Ra = \frac{1}{S_0} \int_{y_1}^{y_2} \int_{x_1}^{x_2} |f(x, y) - Z_0| dx dy \quad \text{[FORMULA 1]}$$

Here, the specific surface is a surface which is a target of roughness measurement, and is a quadrilateral region which is specified by four points represented by the coordinates ($x_1$, $y_1$, $f(x_1, y_1)$), ($x_1$, $y_2$, $f(x_1, y_2)$), ($x_2$, $y_1$, $f(x_2, y_1)$), and ($x_2$, $y_2$, $f(x_2, y_2)$). Moreover, $S_0$ represents the area of a rectangle which is obtained by projecting the specific surface on the x-y plane, and $Z_0$ represents the height of the reference surface (the average height of the specific surface). The $R_a$ can be measured using an atomic force microscope (AFM).

The crystalline oxide semiconductor is preferably a c-axis aligned crystalline oxide semiconductor (CAAC-OS).

The CAAC-OS is not completely single crystal nor completely amorphous. The CAAC-OS is an oxide semiconductor with a crystal-amorphous mixed phase structure where crystal parts with a size of several nanometers to several tens of nanometers are included in an amorphous phase. Note that, from observation with a transmission electron microscope (TEM), a boundary between an amorphous part and a crystal part in the CAAC-OS is not clear. Further, a grain boundary in the CAAC-OS is not found. Since the CAAC-OS does not include a grain boundary, a decrease in electron mobility due to a grain boundary does not easily occur.

In each of the crystal parts included in the CAAC-OS, a c-axis is aligned in a direction perpendicular to a surface where the CAAC-OS is formed or a surface of the CAAC-OS, triangular or hexagonal atomic arrangement is formed when seen from the direction perpendicular to the a-b plane, and metal atoms are arranged in a layered manner or metal atoms and oxygen atoms are arranged in a layered manner when seen from the direction perpendicular to the c-axis. Note that the directions of the a-axis and the b-axis of one crystal part may be different from those of another crystal part.

Note that the proportions of amorphous parts and crystal parts in the CAAC-OS are not necessarily uniform. For example, in the case where crystal growth occurs from a surface side of the CAAC-OS, the proportion of crystal parts in the vicinity of the surface of the CAAC-OS may be high and the proportion of amorphous parts in the vicinity of the surface where the CAAC-OS is formed may be high.

Since the c-axes of the crystal parts included in the CAAC-OS are aligned in the direction perpendicular to the surface where the CAAC-OS is formed or the surface of the CAAC-OS, the directions of the c-axes of the crystal parts may be different from each other depending on the shape of the CAAC-OS (the cross-sectional shape of the surface where the CAAC-OS is formed or the cross-sectional shape of the surface of the CAAC-OS). Note that, when the CAAC-OS is formed, the direction of the c-axis of the crystal part is the direction perpendicular to the surface where the CAAC-OS is formed or the surface of the CAAC-OS. The crystal part is formed by deposition or is formed by performing treatment for crystallization such as heat treatment after deposition.

With the use of the CAAC-OS, change in electric characteristics of the transistor due to irradiation with visible light or ultraviolet light can be reduced, so that a highly reliable transistor can be obtained.

As an example of the above oxide semiconductor layer 403, an In—Ga—Zn-based oxide deposited by a sputtering method using a target containing indium (In), gallium (Ga), and zinc (Zn) can be given. The oxide semiconductor layer 403 can be formed to have a thickness greater than or equal to 1 nm and less than or equal to 30 nm (preferably greater than or equal to 5 nm and less than or equal to 20 nm).

In the case of depositing an In—Ga—Zn-based oxide by a sputtering method, it is preferable to use a target of an In—Ga—Zn-based oxide having an atomic ratio of In:Ga:Zn=1:1:1, 4:2:3, 3:1:2, 1:1:2, 2:1:3, or 3:1:4. When the oxide semiconductor layer is formed using a target of an In—Ga—Zn-based oxide having the above atomic ratio, a polycrystal or a c-axis aligned crystal (CAAC) is likely to be formed. The filling rate of the target containing In, Ga, and Zn is higher than or equal to 90% and lower than or equal to 100%, preferably higher than or equal to 95% and lower than 100%. With the use of the target with a high filling rate, a dense oxide semiconductor layer is formed.

The oxide semiconductor layer may be formed as follows: the substrate is held in a treatment chamber with pressure reduced, moisture remaining in the treatment chamber is removed, a sputtering gas from which hydrogen and moisture are removed is introduced, and the above target is used. The substrate temperature may be higher than or equal to 100° C. and lower than or equal to 600° C., preferably higher than or equal to 200° C. and lower than or equal to 400° C., in the formation. By heating the substrate during the formation, the impurity concentration in the oxide semiconductor layer can be reduced. In addition, damage by sputtering can be reduced. In order to remove moisture remaining in the treatment chamber, an entrapment vacuum pump is preferably used. For example, a cryopump, an ion pump, or a titanium sublimation pump is preferably used. The evacuation unit may be a turbo pump provided with a cold trap.

In the treatment chamber which is evacuated with a cryopump, for example, a hydrogen atom, a compound containing a hydrogen atom, such as water ($H_2O$), (preferably also a compound containing a carbon atom), and the like are removed, whereby the impurity concentration in the oxide semiconductor layer formed in the treatment chamber can be reduced.

Note that the oxide semiconductor layer formed by a sputtering method or the like sometimes contains a large amount of moisture or hydrogen (including a hydroxyl group) as impurities. Thus, in order to reduce impurities such as moisture or hydrogen in the oxide semiconductor layer (in order to perform dehydration or dehydrogenation), the oxide semiconductor layer is subjected to heat treatment in a reduced-pressure atmosphere, an inert gas atmosphere of nitrogen, a rare gas, or the like, an oxygen gas atmosphere, or ultra-dry air (the moisture amount is 20 ppm (−55° C. by conversion into a dew point) or less, preferably 1 ppm or less, further preferably 10 ppb or less, in the case where the measurement is performed with a dew point meter of a cavity ring down laser spectroscopy (CRDS) system).

Heat treatment performed on the oxide semiconductor layer can eliminate moisture or hydrogen in the oxide semiconductor layer. Specifically, the heat treatment may be performed at a temperature higher than or equal to 250° C. and lower than or equal to 750° C., preferably higher than or equal to 400° C. and lower than the strain point of the substrate. For example, the heat treatment may be performed at 500° C. for approximately longer than or equal to 3 minutes and shorter than or equal to 6 minutes. When an RTA method is used for the heat treatment, dehydration or dehydrogenation can be performed in a short time; therefore, treatment can be performed even at a temperature higher than the strain point of a glass substrate.

The heat treatment to eliminate moisture or hydrogen in the oxide semiconductor layer may be performed anytime in the manufacturing process of the transistor 420 after formation of the oxide semiconductor layer 403 before formation of the interlayer insulating layer 408. The heat treatment for dehydration or dehydrogenation may be performed plural times, and may also serve as another heat treatment.

In some cases, the heat treatment makes oxygen released from the oxide semiconductor layer and an oxygen vacancy is formed in the oxide semiconductor layer.

Therefore, it is preferable to use a gate insulating layer containing oxygen as the gate insulating layer which is formed in a later step to be in contact with the oxide semiconductor layer. Then heat treatment is performed after formation of the gate insulating layer containing oxygen, so that oxygen is supplied from the gate insulating layer to the oxide semiconductor layer. With the above structure, oxygen vacancies serving as donors can be reduced and the stoichiometric composition of the oxide semiconductor included in the oxide semiconductor layer can be satisfied. As a result, the oxide semiconductor layer can be made substantially i-type and variation in electric characteristics of the transistor due to oxygen vacancies can be reduced; thus, the electric characteristics can be improved.

The heat treatment for supplying oxygen to the oxide semiconductor layer is performed in a nitrogen atmosphere, ultra-dry air, or a rare gas (e.g., argon or helium) atmosphere preferably at a temperature higher than or equal to 200° C. and lower than or equal to 400° C., for example, higher than or equal to 250° C. and lower than or equal to 350° C. The water content in the gas is preferably 20 ppm or less, further preferably 1 ppm or less, still further preferably 10 ppb or less.

Further or alternatively, oxygen (which includes at least one of an oxygen radical, an oxygen atom, and an oxygen ion) may be introduced into the dehydrated or dehydrogenated oxide semiconductor layer so that oxygen is supplied to the oxide semiconductor layer.

Introduction of oxygen into the dehydrated or dehydrogenated oxide semiconductor layer 403 enables the oxide semiconductor layer 403 to be highly purified and i-type. Change in electric characteristics of the transistor including the highly-purified i-type oxide semiconductor layer 403 is suppressed, and the transistor is electrically stable.

Oxygen can be introduced by an ion implantation method, an ion doping method, a plasma immersion ion implantation method, plasma treatment, or the like.

The oxide semiconductor layer 403 can have an island shape by processing the oxide semiconductor layer 403 through a photolithography process.

Note that etching of the oxide semiconductor layer 403 can be dry etching, wet etching, or both dry etching and wet etching. As an etchant used for wet etching of the oxide semiconductor layer 403, a mixed solution of phosphoric acid, acetic acid, and nitric acid can be used, for example. In addition, ITO07N (produced by KANTO CHEMICAL CO., INC.) may be used.

Next, the gate insulating layer 402 is formed over the oxide semiconductor layer 403.

The gate insulating layer 402 can be formed to have a thickness greater than or equal to 1 nm and less than or equal to 20 nm, preferably greater than or equal to 10 nm and less than or equal to 20 nm, by a sputtering method, an MBE method, a CVD method, a pulsed laser deposition method, an ALD method, or the like as appropriate. The gate insulating layer 402 may be formed with a sputtering apparatus which performs film formation with surfaces of a plurality of substrates set substantially perpendicular to a surface of a sputtering target.

The gate insulating layer 402 can be formed using a silicon oxide film, a gallium oxide film, an aluminum oxide film, a silicon nitride film, a silicon oxynitride film, an aluminum oxynitride film, or a silicon nitride oxide film.

It is preferable that the gate insulating layer 402 contain oxygen in a portion which is in contact with the oxide semiconductor layer 403. In particular, the gate insulating layer 402 preferably contains oxygen at least in excess of the stoichiometric composition in (a bulk of) the layer. For example, in the case where silicon oxide is used for the gate insulating layer 402, the composition formula is $SiO_{2+\alpha}$ ($\alpha>0$).

In this embodiment, silicon oxide of $SiO_{2+\alpha}$ ($\alpha>0$) is used for the gate insulating layer 402. By using the silicon oxide for the gate insulating layer 402, oxygen can be supplied to the oxide semiconductor layer 403, leading to favorable characteristics.

When the gate insulating layer 402 is formed using a high-k material such as hafnium oxide, yttrium oxide, hafnium silicate ($HfSi_xO_y$ ($x>0$, $y>0$)), hafnium silicate to which nitrogen is added ($HfSiO_xN_y$ ($x>0$, $y>0$)), hafnium aluminate ($HfAl_xO_y$ ($x>0$, $y>0$)), or lanthanum oxide, gate leakage current can be reduced. Further, the gate insulating layer 402 may have a single-layer structure or a stacked structure.

Figure 2B:
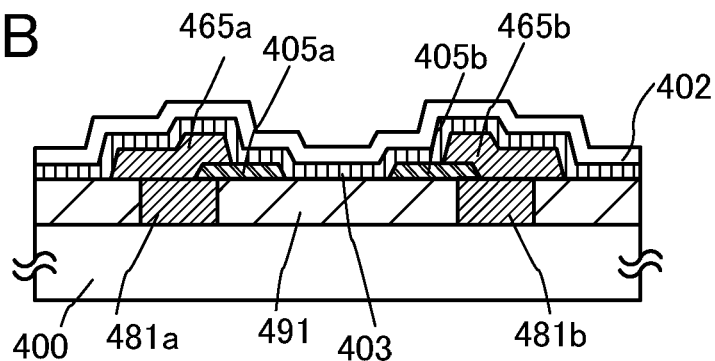

The foregoing is the description of the process to obtain the state illustrated in FIG. 2B.

Then a conductive layer is formed over the gate insulating layer 402 by a plasma CVD method, a sputtering method, or the like. Next, through a photolithography process, a resist mask is formed over the conductive layer and etching treatment is performed partly thereon, so that the gate electrode 401 is formed. Then the resist mask is removed.

The gate electrode 401 can be formed using a metal material such as molybdenum, titanium, tantalum, tungsten, aluminum, copper, chromium, neodymium, or scandium, or an alloy material containing any of these materials as a main component. Alternatively, a semiconductor film typified by a polycrystalline silicon film doped with an impurity element such as phosphorus, or a silicide film such as a nickel silicide film may be used for the gate electrode 401. The gate electrode 401 may have a single-layer structure or a stacked structure.

The gate electrode 401 can also be formed using a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible that the gate electrode 401 has a stacked structure of the above conductive material and the above metal material.

As one layer of the gate electrode 401 which is in contact with the gate insulating layer 402, a metal oxide film containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. These films each have a work function higher than or equal to 5 eV, preferably higher than or equal to 5.5 eV; thus, when these films are used for the gate electrode, the threshold voltage of the electric characteristics of the transistor can be positive. Accordingly, a so-called normally-off switching element can be achieved.

Figure 2C:
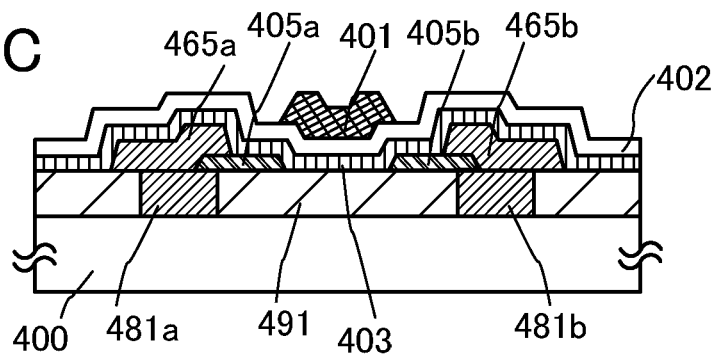

The foregoing is the description of the process to obtain the state illustrated in FIG. 2C.

Figure 2D:
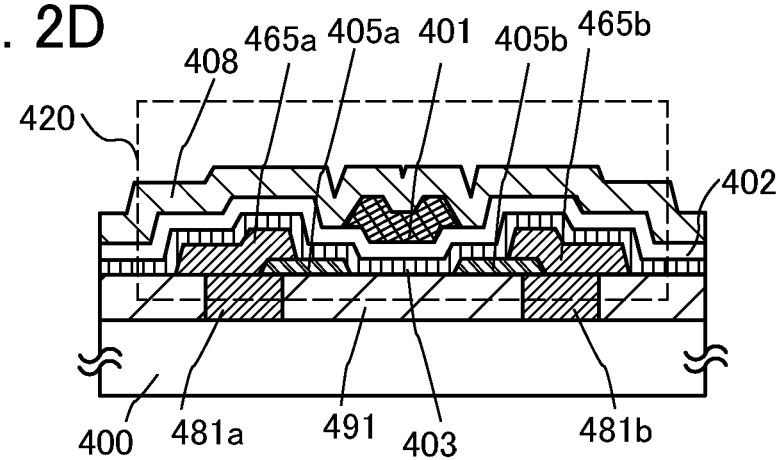

Next, the interlayer insulating layer 408 is formed over the gate insulating layer 402 and the gate electrode 401 (see FIG. 2D).

The interlayer insulating layer 408 can be formed by a plasma CVD method, a sputtering method, an evaporation method, or the like. As the interlayer insulating layer 408, for example, an inorganic insulating layer such as a silicon oxide layer, a silicon oxynitride layer, an aluminum oxynitride layer, or a gallium oxide layer can be typically used.

Further, as examples of a material for the interlayer insulating layer 408, aluminum oxide, hafnium oxide, magnesium oxide, zirconium oxide, lanthanum oxide, barium oxide, and a metal nitride (e.g., aluminum nitride) can be given.

The interlayer insulating layer 408 may be a single layer or a stack of layers, and for example, a stack of a silicon oxide film and an aluminum oxide film can be used.

The interlayer insulating layer 408 is preferably formed as appropriate by a method such as a sputtering method, by which impurities such as water and hydrogen do not enter the interlayer insulating layer 408.

In this embodiment, a silicon oxide film with a thickness of 100 nm is formed as the interlayer insulating layer 408 by a sputtering method. The silicon oxide film can be formed by a sputtering method in a rare gas (typically argon) atmosphere, an oxygen atmosphere, or a mixed atmosphere of a rare gas and oxygen.

As in the case of the formation of the oxide semiconductor layer, an entrapment vacuum pump (e.g., a cryopump) is preferably used in order to remove moisture remaining in a deposition chamber of the interlayer insulating layer 408. When the interlayer insulating layer 408 is formed in the deposition chamber which is evacuated with a cryopump, the impurity concentration in the interlayer insulating layer 408 can be reduced. In addition, as an evacuation unit for removing moisture remaining in the deposition chamber of the interlayer insulating layer 408, a turbo molecular pump provided with a cold trap may be used.

A high-purity gas from which impurities such as hydrogen, water, a hydroxyl group, and a hydride are removed is preferably used as a sputtering gas used in the formation of the interlayer insulating layer 408.

An aluminum oxide film which can be used as the interlayer insulating layer 408 provided over the oxide semiconductor layer 403 has a high shielding effect (blocking effect) of preventing penetration of both oxygen and impurities such as hydrogen and moisture.

Therefore, during and after the manufacturing process, the aluminum oxide film functions as a protective film for preventing entry of impurities such as hydrogen and moisture, which cause a change, into the oxide semiconductor layer 403 and release of oxygen, which is a main constituent material of the oxide semiconductor, from the oxide semiconductor layer 403.

Further, a planarization insulating film may be formed in order to reduce surface roughness due to the transistor. For the planarization insulating film, an organic material such as a polyimide resin, an acrylic resin, or a benzocyclobutene resin can be used. Other than such organic materials, it is also possible to use a low-dielectric constant material (low-k material) or the like. Note that the planarization insulating film may be formed by stacking a plurality of insulating films formed using any of these materials.

Through the above steps, the transistor 420 of this embodiment is manufactured. The oxide semiconductor layer 403 containing at least indium, zinc, and oxygen is used, the end portions of the conductive layers functioning as the source electrode and the drain electrode overlap with the gate electrode 401, and the gate electrode 401 surely overlaps with the region serving as the channel formation region of the oxide semiconductor layer 403; thus, the on-state characteristics of the transistor can be improved. Moreover, by reducing contact resistance, high-speed driving of a semiconductor device can be achieved and a highly reliable structure can be provided.

Figure 6A:
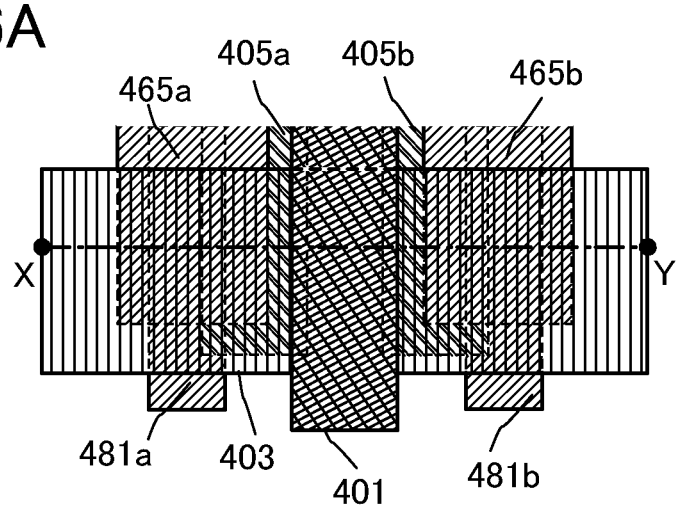
FIGS. 6A and 6B are a plan view and a cross-sectional view which illustrate one embodiment of a semiconductor device.
Figure 6B:
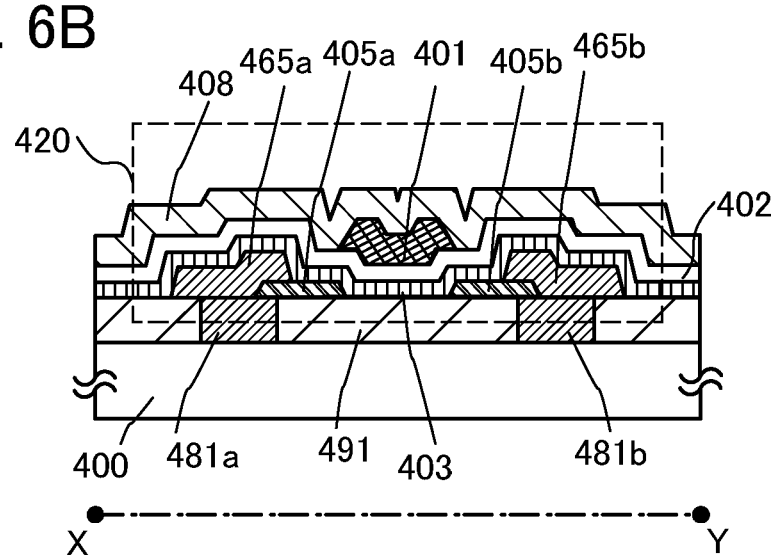

FIG. 6A is a plan view of the transistor 420 in FIG. 1, and FIG. 6B is a cross-sectional view taken along line X-Y in FIG. 6A.

In the structure of FIGS. 6A and 6B, end portions of the first conductive layers 405a and 405b functioning as a source electrode and a drain electrode of the transistor 420 overlap with end portions of the gate electrode 401, and the gate electrode 401 surely overlaps with a region serving as a channel formation region of the oxide semiconductor layer 403; thus, on-state characteristics of the transistor can be improved. Accordingly, high-speed driving of a semiconductor device can be achieved.

Further, in the structure of FIGS. 6A and 6B disclosed in this embodiment, the first conductive layers 405a and 405b can be formed to be thin. By forming the first conductive layers 405a and 405b to be thin, the gate insulating layer 402 can be formed on a less stepped surface especially in the vicinity of the channel formation region of the oxide semiconductor layer 403. Consequently, coverage failure with the gate insulating layer 402 is reduced, leading to a reduction in occurrence of a short circuit between electrodes and improvement in reliability.

Further, in the structure of FIGS. 6A and 6B disclosed in this embodiment, not only the gate insulating layer 402 but also the oxide semiconductor layer 403 can be thinned. A reduction in the thicknesses of the gate insulating layer 402 and the oxide semiconductor layer 403 not only leads to improvement in on-state characteristics but also enables the transistor to operate as a fully depleted transistor. Such operation of the transistor as the fully depleted transistor enables high integration, high-speed driving, and low power consumption.

In addition, in the structure of FIGS. 6A and 6B disclosed in this embodiment, the first embedded conductive layer 481a and the second embedded conductive layer 481b are provided in a lower portion of the transistor 420, which avoids the need to provide contacts in the gate insulating layer 402 and the interlayer insulating layer 408. A large contact area can be obtained between the first embedded conductive layer 481a and the source electrode or the drain electrode, and a large contact area can be obtained between the second embedded conductive layer 481b and the source electrode or the drain electrode; thus, contact resistance can be reduced. In addition, the large contact area leads to a shorter distance between an end portion of the gate electrode 401 and the contact.

As described above, in the structure of the transistor 420, the on-state characteristics can be improved without decreasing the source-drain current of the transistor. Further, the oxide semiconductor layer and the gate insulating layer are thinned, whereby coverage failure with the gate insulating layer can be reduced and the transistor 420, in which the channel formation region is provided in the oxide semiconductor layer 403, can be miniaturized.

A modified example of the transistor 420 illustrated in FIG. 1 is described with reference to FIG. 3. Repetitive description of portions which are the same as or have functions similar to those of the portions in FIG. 1 is omitted in the following description of FIG. 3. In addition, detailed description of the same portions is omitted.

Figure 3:
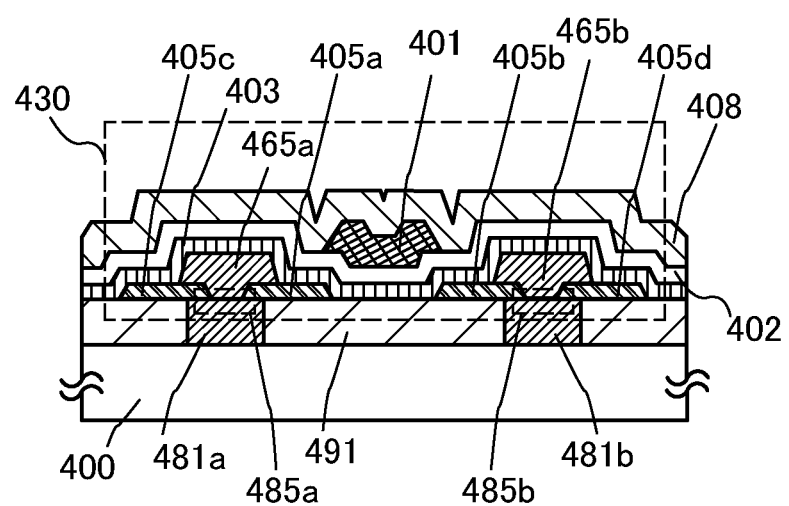
FIG. 3 is a diagram illustrating one embodiment of a semiconductor device.

A transistor 430 includes, over the substrate 400 having an insulating surface, the insulating layer 491 provided with the first embedded conductive layer 481a and the second embedded conductive layer 481b, the oxide semiconductor layer 403, first conductive layers 405a, 405b, 405c, and 405d, the second conductive layers 465a and 465b, the gate insulating layer 402, the gate electrode 401, and the interlayer insulating layer 408 (see FIG. 3).

In the structure of the transistor 430 illustrated in FIG. 3, openings are provided in first conductive layers, which is different from the structure of the transistor 420 illustrated in FIG. 1, where no opening is provided in the first conductive layers.

In the structure of FIG. 3 disclosed in this embodiment, an opening 485a is provided in the first conductive layer, so that the first conductive layer 405a and the first conductive layer 405c are formed. Similarly, an opening 485b is provided in the first conductive layer, so that the first conductive layer 405b and the first conductive layer 405d are formed. Therefore, in the structure of the transistor 430 in FIG. 3, the contact area between the first embedded conductive layer 481a and the first conductive layer and the contact area between the second embedded conductive layer 481b and the first conductive layer are larger than those in the structure of the transistor 420 in FIG. 1.

The first embedded conductive layer 481a and the second embedded conductive layer 481b are provided in a lower portion of the transistor 430, which avoids the need to provide contacts in the gate insulating layer 402 and the interlayer insulating layer 408. Therefore, large contact areas can be obtained between the first and second embedded conductive layers 481a and 481b and source and drain electrodes; thus, contact resistance can be reduced.

In the structure of FIG. 3 disclosed in this embodiment, the opening 485a is provided in the first conductive layer, and the first conductive layer 405a, the first conductive layer 405c, and the second conductive layer 465a are directly connected to the first embedded conductive layer 481a. Further, the opening 485b is provided in the first conductive layer, and the first conductive layer 405b, the first conductive layer 405d, and the second conductive layer 465b are directly connected to the second embedded conductive layer 481b. With this structure, current flowing through the first conductive layers, the second conductive layers, and the embedded conductive layers can be increased.

As described above, in each of the structure of the transistor 420 illustrated in FIG. 1 and the structure of the transistor 430 illustrated in FIG. 3, the on-state characteristics can be improved without decreasing the source-drain current of the transistor. Further, the oxide semiconductor layer and the gate insulating layer are thinned, whereby coverage failure with the gate insulating layer can be reduced and the transistor in which the channel formation region is formed using an oxide semiconductor can be miniaturized. Further, by providing the embedded conductive layers, the contact resistance of the transistor can be reduced.

This embodiment can be implemented in combination with any of the other embodiments as appropriate.

(Embodiment 2)

In this embodiment, other embodiments of a semiconductor device are described with reference to FIG. 4 and FIG. 5. The description in the above embodiment can be applied to portions and steps which are the same as or have functions similar to those of the portions and steps in the above embodiment; thus, repetitive description is omitted. In addition, detailed description of the same portions is omitted.

Figure 4:
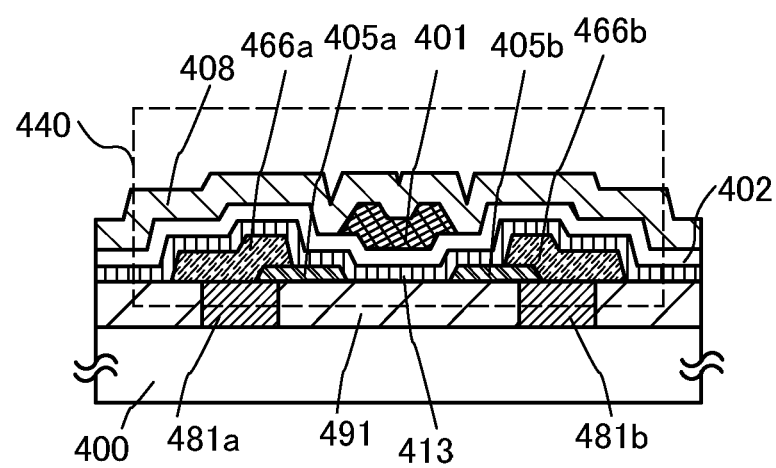
FIG. 4 is a diagram illustrating one embodiment of a semiconductor device.

FIG. 4 is a cross-sectional view of a transistor 440 which has a structure different from that of the semiconductor device described in Embodiment 1.

The transistor 440 includes, over the substrate 400 having an insulating surface, the insulating layer 491 provided with the first embedded conductive layer 481a and the second embedded conductive layer 481b, first oxide semiconductor layers 466a and 466b, a second oxide semiconductor layer 413, the first conductive layers 405a and 405b, the gate insulating layer 402, the gate electrode 401, and the interlayer insulating layer 408 (see FIG. 4).

In the structure of FIG. 4 disclosed in this embodiment, the gate electrode 401 is provided to overlap with the first conductive layer 405a and the first conductive layer 405b with the second oxide semiconductor layer 413 and the gate insulating layer 402 interposed between the gate electrode 401 and the first conductive layers 405a and 405b. Further, the gate electrode 401 is provided to partly overlap with a top surface of the insulating layer 491 between the first embedded conductive layer 481a and the second embedded conductive layer 481b with the second oxide semiconductor layer 413 and the gate insulating layer 402 interposed between the gate electrode 401 and the insulating layer 491. That is, the gate electrode 401 is provided to overlap with a region serving as a channel formation region of the second oxide semiconductor layer 413.

Note that the gate electrode 401 is provided between an end portion of the first oxide semiconductor layer 466a which is formed to partly cover the first conductive layer 405a and an end portion of the first oxide semiconductor layer 466b which is formed to partly cover the first conductive layer 405b. Further, the gate electrode 401 is spaced from each of the end portions of the first oxide semiconductor layers 466a and 466b.

Further, the first embedded conductive layer 481a is partly in contact with the first conductive layer 405a and the first oxide semiconductor layer 466a. Similarly, the second embedded conductive layer 481b is partly in contact with the first conductive layer 405b and the first oxide semiconductor layer 466b.

In the structure of FIG. 4 disclosed in this embodiment, the first embedded conductive layer 481a and the second embedded conductive layer 481b are provided in a lower portion of the transistor 440, which avoids the need to provide contacts in the gate insulating layer 402 and the interlayer insulating layer 408. Therefore, a large contact area can be obtained between the first embedded conductive layer 481a and a source electrode or a drain electrode, and a large contact area can be obtained between the second embedded conductive layer 481b and the source electrode or the drain electrode; thus, contact resistance can be reduced. In addition, the large contact area leads to a shorter distance between an end portion of the gate electrode 401 and the contact.

End portions of the first conductive layers 405a and 405b functioning as the source electrode and the drain electrode of the transistor 440 overlap with end portions of the gate electrode 401, and the gate electrode 401 surely overlaps with the region serving as the channel formation region of the second oxide semiconductor layer 413; thus, on-state characteristics of the transistor can be improved to achieve high-speed driving of a semiconductor device.

Further, in the structure of FIG. 4 disclosed in this embodiment, the first conductive layers 405a and 405b, which function as the source electrode and the drain electrode of the transistor, can be formed to be thin; therefore, the gate insulating layer 402 can be formed on a less stepped surface especially in the vicinity of the channel formation region of the second oxide semiconductor layer 413. Accordingly, the gate insulating layer 402 can be formed with good coverage.

Further, since the first conductive layers 405a and 405b can be formed to be thin, the time taken to form the first conductive layers 405a and 405b by a process such as etching can be shortened.

Further, in the structure of FIG. 4 disclosed in this embodiment, not only the gate insulating layer 402 but also the second oxide semiconductor layer 413 can be thinned. Accordingly, the on-state characteristics can be improved, and the transistor can operate as a fully depleted transistor, which enables high integration, high-speed driving, and low power consumption.

As described above, in the structure of FIG. 4 disclosed in this embodiment, the end portions of the first conductive layers 405a and 405b overlap with the gate electrode 401, and the gate electrode 401 surely overlaps with the region serving as the channel formation region of the second oxide semiconductor layer 413; thus, the on-state characteristics of the transistor can be improved. Moreover, by increasing the contact areas between the first and second embedded conductive layers 481a and 481b and the source and drain electrodes, contact resistance can be reduced.

A modified example of the transistor 440 illustrated in FIG. 4 is described with reference to FIG. 5. Repetitive description of portions which are the same as or have functions similar to those of the portions in FIG. 4 is omitted in the following description of FIG. 5. In addition, detailed description of the same portions is omitted.

Figure 5:
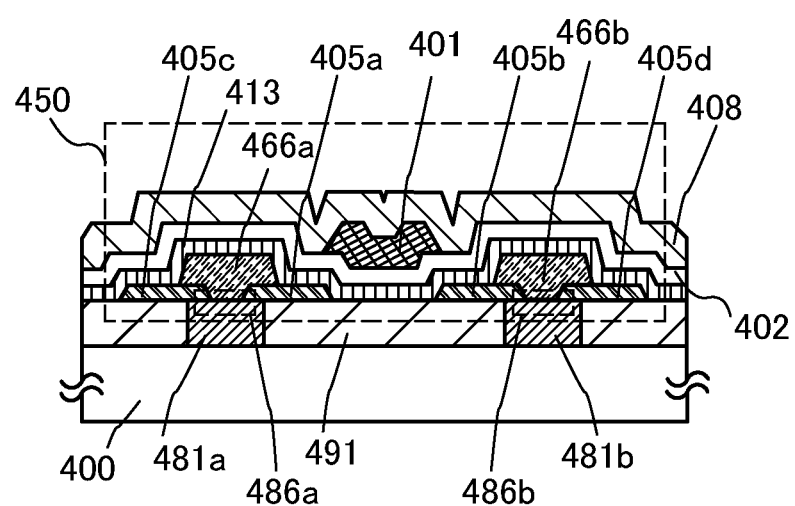
FIG. 5 is a diagram illustrating one embodiment of a semiconductor device.

A transistor 450 includes, over the substrate 400 having an insulating surface, the insulating layer 491 provided with the first embedded conductive layer 481a and the second embedded conductive layer 481b, the first oxide semiconductor layers 466a and 466b, the second oxide semiconductor layer 413, the first conductive layers 405a, 405b, 405c, and 405d, the gate insulating layer 402, the gate electrode 401, and the interlayer insulating layer 408 (see FIG. 5).

In the structure of the transistor 450 illustrated in FIG. 5, openings are provided in first conductive layers, which is different from the structure of the transistor 440 illustrated in FIG. 4, where no opening is provided in the first conductive layers.

In the structure of FIG. 5 disclosed in this embodiment, an opening 486a is provided in the first conductive layer, so that the first conductive layer 405a and the first conductive layer 405c are formed. Similarly, an opening 486b is provided in the first conductive layer, so that the first conductive layer 405b and the first conductive layer 405d are formed. Therefore, in the structure of the transistor 450 in FIG. 5, the contact area between the first embedded conductive layer 481a and the first conductive layer and the contact area between the second embedded conductive layer 481b and the first conductive layer are larger than those in the structure of the transistor 440 in FIG. 4.

The first embedded conductive layer 481a and the second embedded conductive layer 481b are provided in a lower portion of the transistor 450, which avoids the need to provide contacts in the gate insulating layer 402 and the interlayer insulating layer 408. Therefore, large contact areas can be obtained between the first and second embedded conductive layers 481a and 481b and source and drain electrodes; thus, contact resistance can be reduced.

In the structure of FIG. 5 disclosed in this embodiment, the opening 486a is provided in the first conductive layer, and the first conductive layer 405a, the first conductive layer 405c, and the first oxide semiconductor layer 466a are directly connected to the first embedded conductive layer 481a. Further, the opening 486b is provided in the first conductive layer, and the first conductive layer 405b, the first conductive layer 405d, and the first oxide semiconductor layer 466b are directly connected to the second embedded conductive layer 481b. With this structure, current flowing through the first conductive layers, the first oxide semiconductor layers, and the embedded conductive layers can be increased.

As described above, in each of the structure of the transistor 440 illustrated in FIG. 4 and the structure of the transistor 450 illustrated in FIG. 5, the on-state characteristics can be improved without decreasing the source-drain current of the transistor. Further, the oxide semiconductor layer and the gate insulating layer are thinned, whereby coverage failure with the gate insulating layer can be reduced and the transistor in which the channel formation region is formed using an oxide semiconductor can be miniaturized. Further, by providing the embedded conductive layers, the contact resistance of the transistor can be reduced.

This embodiment can be implemented in combination with any of the other embodiments as appropriate.

(Embodiment 3)

In this embodiment, a semiconductor device which includes any of the transistors described in Embodiments 1 and 2, which can hold stored data even when not powered, and which does not have a limitation on the number of write cycles is described with reference to FIGS. 7A and 7B. Note that a transistor 162 included in the semiconductor device of this embodiment is any of the transistors described in Embodiments 1 and 2.

Figure 7A:
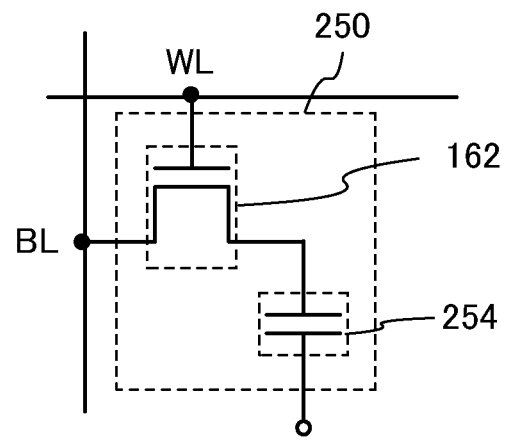
FIGS. 7A and 7B are a circuit diagram and a perspective view each of which illustrates one embodiment of a semiconductor device.
Figure 7B:
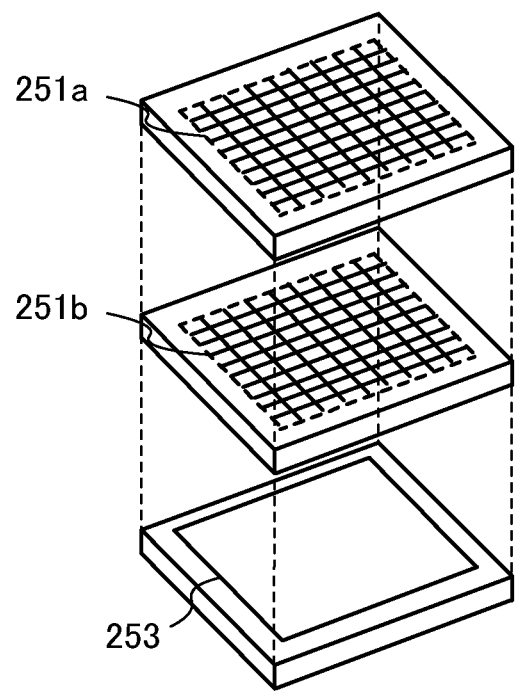

FIG. 7A illustrates an example of a circuit configuration of a semiconductor device, and FIG. 7B is a conceptual diagram illustrating an example of a semiconductor device. First, the semiconductor device illustrated in FIG. 7A is described, and then the semiconductor device illustrated in FIG. 7B is described.

In the semiconductor device illustrated in FIG. 7A, a bit line BL is connected to one of a source electrode and a drain electrode of the transistor 162. A word line WL is connected to a gate electrode of the transistor 162. The other of the source electrode and the drain electrode of the transistor 162 is connected to one electrode of a capacitor 254.

The transistor 162 formed using an oxide semiconductor has extremely small off-state current. For that reason, the potential of the one electrode of the capacitor 254 (or charge accumulated in the capacitor 254) can be held for an extremely long time by turning off the transistor 162.

Next, writing and holding of data in the semiconductor device (a memory cell 250) illustrated in FIG. 7A are described.

First, the potential of the word line WL is set to a potential at which the transistor 162 is turned on, so that the transistor 162 is turned on. Accordingly, the potential of the bit line BL is supplied to the one electrode of the capacitor 254 (writing). After that, the potential of the word line WL is set to a potential at which the transistor 162 is turned off, so that the transistor 162 is turned off. Thus, the potential of the one electrode of the capacitor 254 is held (holding).

Since the off-state current of the transistor 162 is extremely small, the potential of the one electrode of the capacitor 254 (or the charge accumulated in the capacitor) can be held for a long time.

Next, reading of data is described. When the transistor 162 is turned on, the bit line BL in a floating state and the one electrode of the capacitor 254 are electrically connected to each other, and the charge is redistributed between the bit line BL and the one electrode of the capacitor 254. As a result, the potential of the bit line BL is changed. The amount of change in the potential of the bit line BL varies depending on the potential of the one electrode of the capacitor 254 (or the charge accumulated in the capacitor 254).

For example, the potential of the bit line BL after charge redistribution is $(C_B \times V_{B0} + C \times V)/(C_B + C)$, where V is the potential of the one electrode of the capacitor 254, C is the static capacitance of the capacitor 254, $C_B$ is the static capacitance of the bit line BL (hereinafter also referred to as bit line capacitance), and $V_{B0}$ is the potential of the bit line BL before the charge redistribution. Therefore, it can be found that, assuming that the memory cell 250 is in either of two states in which the potentials of the one electrode of the capacitor 254 are $V_1$ and $V_0$ ($V_1 > V_0$), the potential of the bit line BL in the case where the potential $V_1$ is held ($=(C_B \times V_{B0} + C \times V_1)/(C_B + C)$) is higher than the potential of the bit line BL in the case where the potential $V_0$ is held ($=(C_B \times V_{B0} + C \times V_0)/(C_B + C)$).

Then, by comparing the potential of the bit line BL with a predetermined potential, data can be read.

As described above, the semiconductor device illustrated in FIG. 7A can hold charge that is accumulated in the capacitor 254 for a long time because the off-state current of the transistor 162 is extremely small. In other words, power consumption can be sufficiently reduced because refresh operation becomes unnecessary or the frequency of refresh operation can be extremely low. Moreover, stored data can be held for a long time even when power is not supplied.

Next, the semiconductor device illustrated in FIG. 7B is described.

The semiconductor device illustrated in FIG. 7B includes memory cell arrays 251a and 251b each including a plurality of memory cells 250 illustrated in FIG. 7A as memory circuits in an upper portion, and a peripheral circuit 253 in a lower portion which is necessary for operation of the memory cell arrays 251a and 251b. Note that the peripheral circuit 253 is connected to the memory cell arrays 251a and 251b.

In the structure illustrated in FIG. 7B, the peripheral circuit 253 can be provided directly under the memory cell arrays 251a and 251b. Thus, the size of the semiconductor device can be reduced.

It is preferable that a semiconductor material for a transistor provided in the peripheral circuit 253 be different from that for the transistor 162. For example, silicon, germanium, silicon germanium, silicon carbide, or gallium arsenide can be used, and a single crystal semiconductor is preferably used. Alternatively, an organic semiconductor material or the like may be used. A transistor formed using such a semiconductor material can operate at sufficiently high speed. Therefore, a variety of circuits (e.g., a logic circuit or a driver circuit) which need to operate at high speed can be favorably realized with the use of the transistor.

Note that FIG. 7B illustrates, as an example, the semiconductor device in which two memory cell arrays (the memory cell array 251a and the memory cell array 251b) are stacked; however, the number of memory cell arrays to be stacked is not limited thereto. Three or more memory cell arrays may be stacked.

As described above, by using any of the transistors described in Embodiments 1 and 2 as the transistor 162 provided in the memory cell 250, on-state characteristics can be improved without decreasing the source-drain current of the transistor 162. Further, embedded conductive layers are provided in the transistor 162, which contributes to lower contact resistance. Furthermore, the oxide semiconductor layer and the gate insulating layer are thinned, whereby coverage failure with the gate insulating layer can be reduced and the transistor 162 can be miniaturized. Consequently, higher integration and higher driving speed of the semiconductor device in which the memory cell arrays 251a and 251b and the peripheral circuit 253 are integrated can be achieved.

Furthermore, since the off-state current of the transistor 162 formed using a non-single-crystal oxide semiconductor containing at least indium, a Group 3 element, zinc, and oxygen is small, stored data can be held for a long time owing to the transistor. In other words, power consumption of the semiconductor device can be sufficiently reduced because the frequency of refresh operation can be extremely low.

This embodiment can be implemented in combination with any of the other embodiments as appropriate.

(Embodiment 4)

In this embodiment, examples of application of the semiconductor device described in the above embodiment to a portable device such as a mobile phone, a smartphone, or an e-book reader are described with reference to FIGS. 8A and 8B, FIG. 9, FIG. 10, and FIG. 11.

In portable devices such as a mobile phone, a smartphone, and an e-book reader, an SRAM or a DRAM is used to store image data temporarily. An SRAM or a DRAM is used because a flash memory is slow in responding and is not suitable for image processing. On the other hand, an SRAM or a DRAM has the following characteristics when used for temporary storage of image data.

Figure 8A:
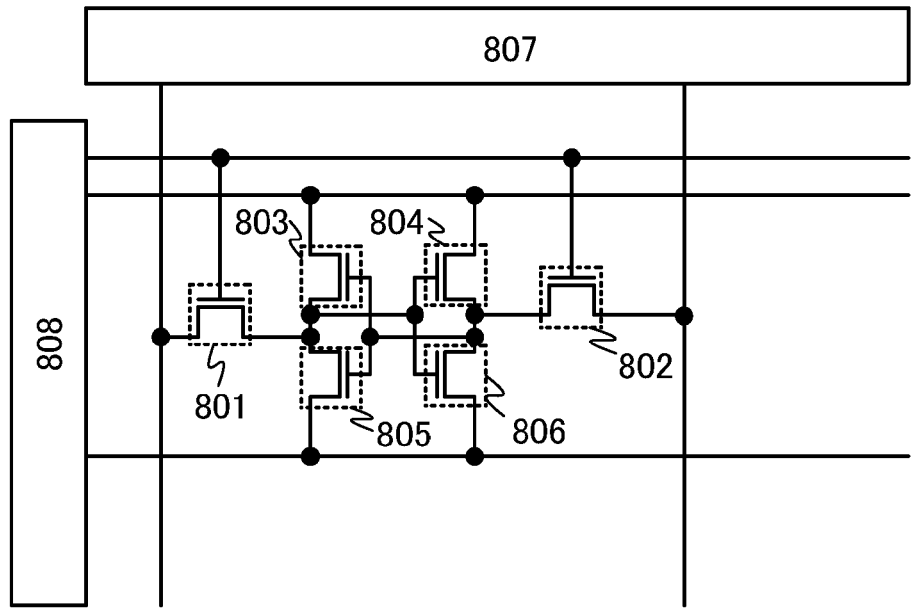
FIGS. 8A and 8B are circuit diagrams each illustrating one embodiment of a semiconductor device.

In an ordinary SRAM, as illustrated in FIG. 8A, one memory cell includes six transistors, that is, transistors 801 to 806, which are driven with an X decoder 807 and a Y decoder 808. The transistor 803 and the transistor 805 form an inverter and the transistor 804 and the transistor 806 form an inverter, which enables high-speed driving. However, an SRAM has a disadvantage of a large cell area because one memory cell includes six transistors. Provided that the minimum feature size of a design rule is F, the area of a memory cell in an SRAM is generally 100 $F^2$ to 150 $F^2$. Therefore, the price per bit of an SRAM is the most expensive among a variety of memory devices.

Figure 8B:
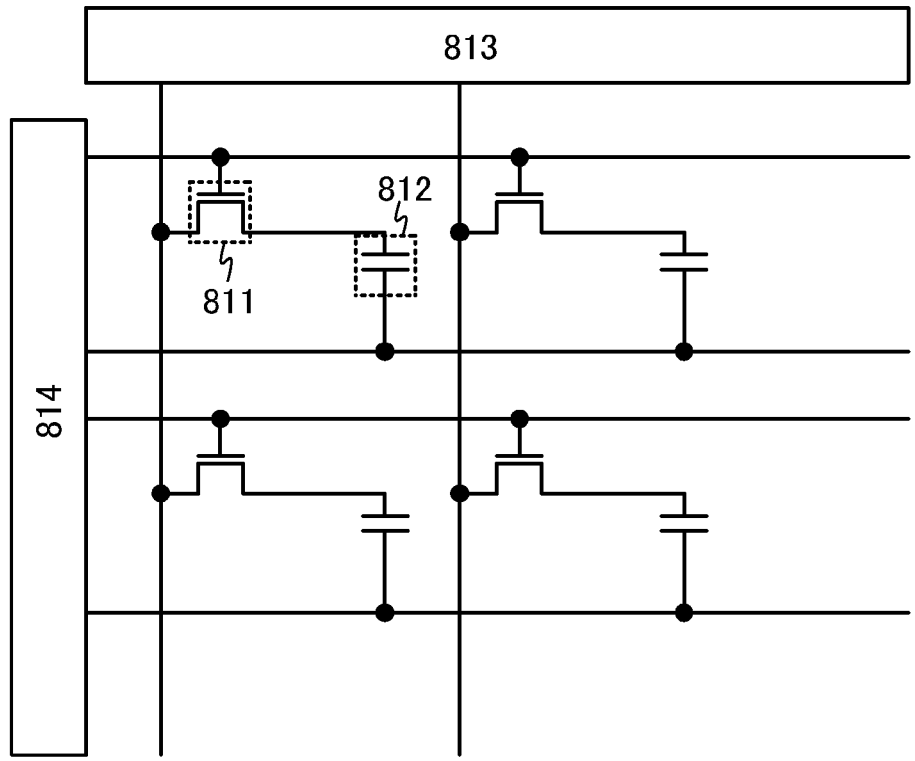

In a DRAM, as illustrated in FIG. 8B, a memory cell includes a transistor 811 and a storage capacitor 812, which are driven with an X decoder 813 and a Y decoder 814. One cell includes one transistor and one capacitor and has a small area. The area of a memory cell in a DRAM is generally less than or equal to 10 $F^2$. Note that the DRAM needs to be refreshed periodically and consumes power even when rewriting is not performed.

On the other hand, the memory cell of the semiconductor device described in the above embodiment has an area of approximately 10 $F^2$ and does not need to be refreshed frequently. Therefore, the area of the memory cell can be reduced, and the power consumption can be reduced.

Figure 9:
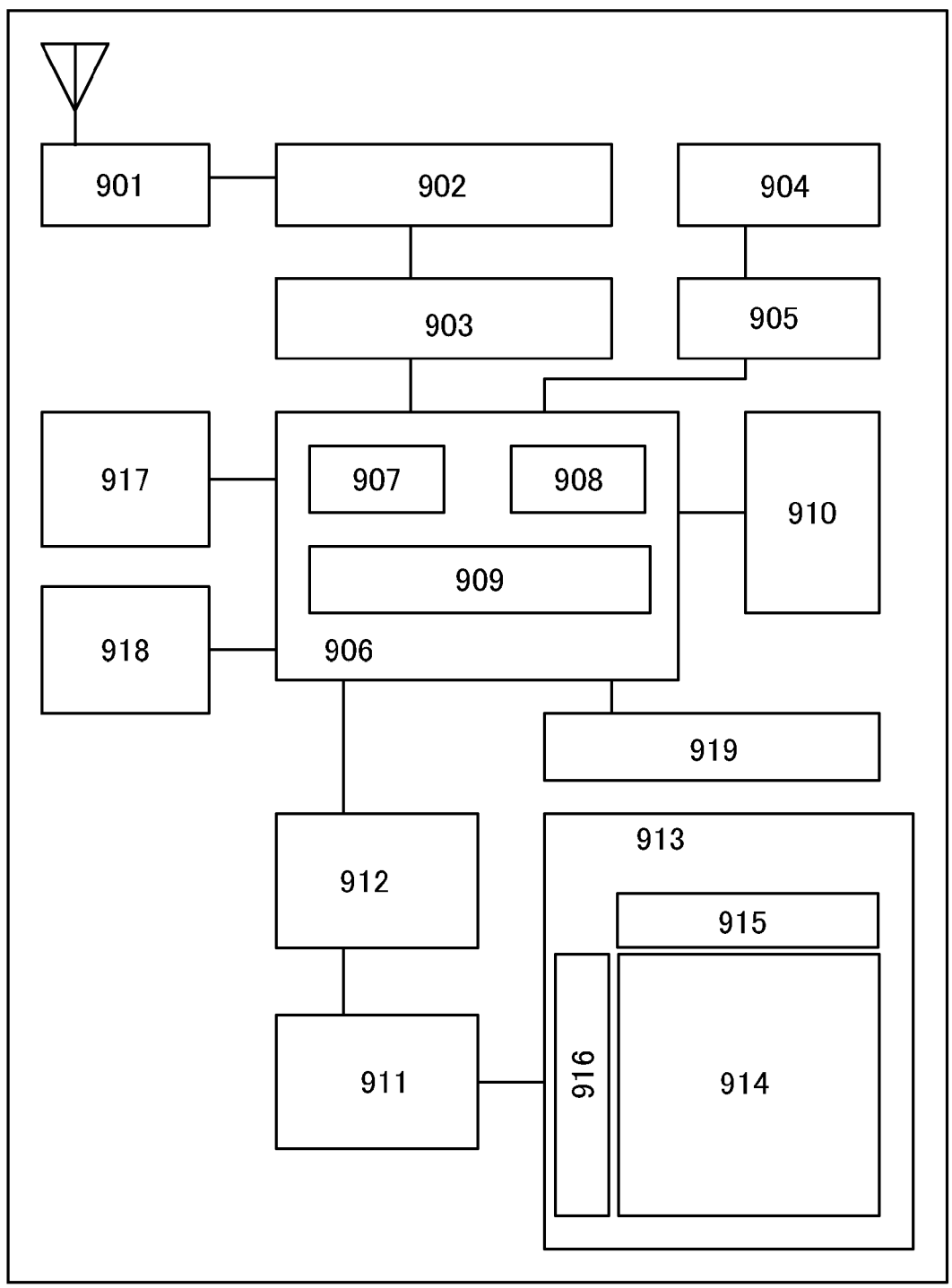
FIG. 9 is a block diagram illustrating one embodiment of a semiconductor device.

FIG. 9 is a block diagram of a portable device. The portable device illustrated in FIG. 9 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface 909 (IF 909). In general, the memory circuit 912 includes an SRAM or a DRAM; by employing the semiconductor device described in the above embodiment for the memory circuit 912, writing and reading of data can be performed at high speed, data can be held for a long time, and power consumption can be sufficiently reduced.

Figure 10:
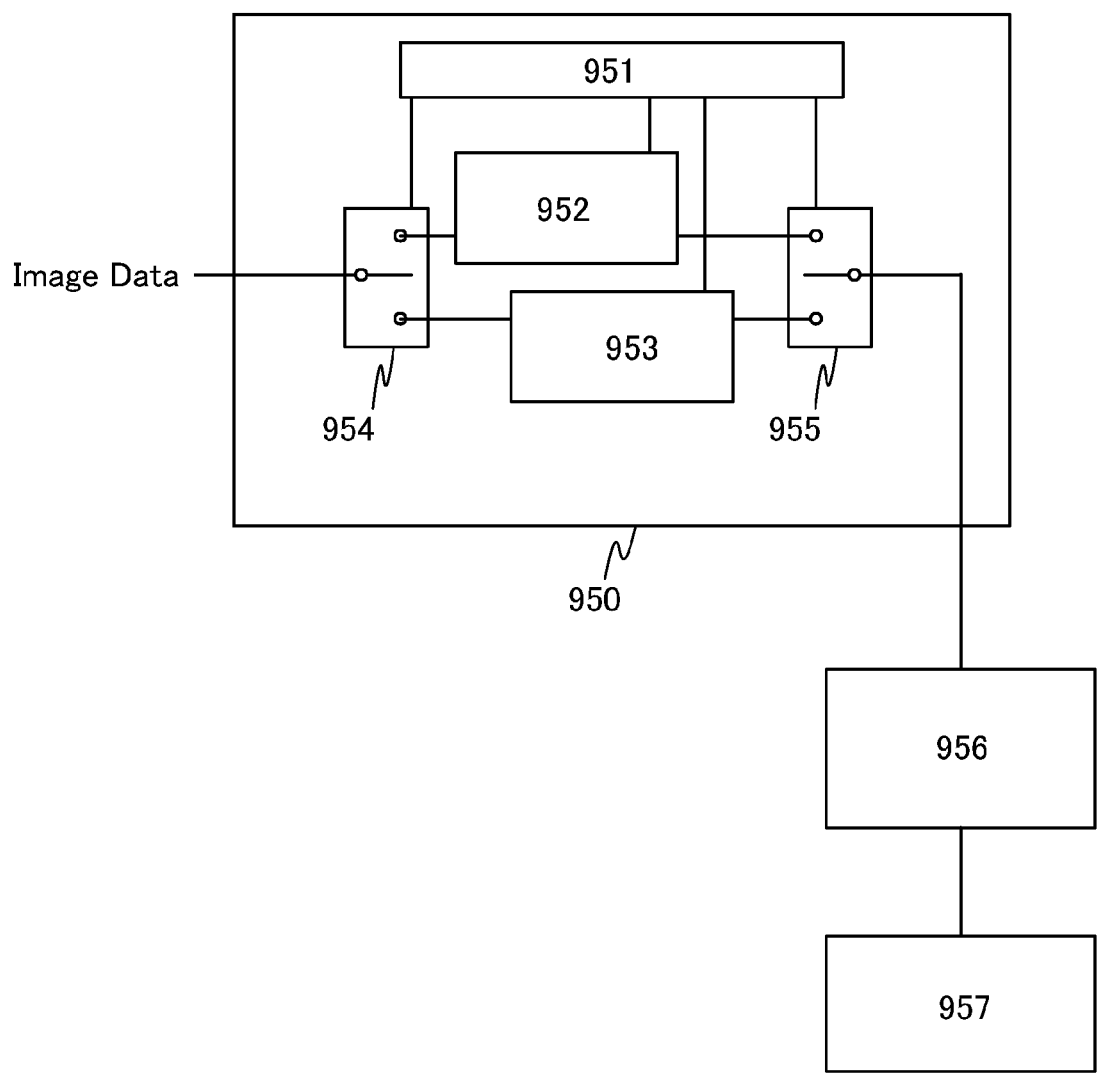
FIG. 10 is a block diagram illustrating one embodiment of a semiconductor device.

FIG. 10 illustrates an example in which the semiconductor device described in the above embodiment is used for a memory circuit 950 for a display. The memory circuit 950 illustrated in FIG. 10 includes a memory 952, a memory 953, a switch 954, a switch 955, and a memory controller 951. The memory circuit 950 is connected to a display controller 956 which reads and controls image data input through a signal line (input image data) and data stored in the memory 952 and the memory 953 (stored image data), and is also connected to a display 957 which displays an image based on a signal from the display controller 956.

First, image data (input image data A) is formed by an application processor (not shown). The input image data A is stored in the memory 952 through the switch 954. Then the image data stored in the memory 952 (stored image data A) is transmitted to the display 957 through the switch 955 and the display controller 956, and is displayed on the display 957.

In the case where the input image data A is not changed, the stored image data A is read from the memory 952 through the switch 955 by the display controller 956 at a frequency of approximately 30 Hz to 60 Hz in general.

Next, for example, when a user performs operation to rewrite a screen (i.e., when the input image data A is changed), the application processor forms new image data (input image data B). The input image data B is stored in the memory 953 through the switch 954. The stored image data A is read periodically from the memory 952 through the switch 955 even during that time. After the completion of storing the new image data (stored image data B) in the memory 953, from the next frame for the display 957, the stored image data B starts to be read, transmitted to the display 957 through the switch 955 and the display controller 956, and displayed on the display 957. This reading operation is continued until another new image data is stored in the memory 952.

By alternately writing and reading image data into and from the memory 952 and the memory 953 as described above, images are displayed on the display 957. Note that the memory 952 and the memory 953 are not limited to separate memories, and a single memory may be divided and used. By employing the semiconductor device described in the above embodiment for the memory 952 and the memory 953, writing and reading of data can be performed at high speed, data can be held for a long time, and power consumption can be sufficiently reduced.

Figure 11:
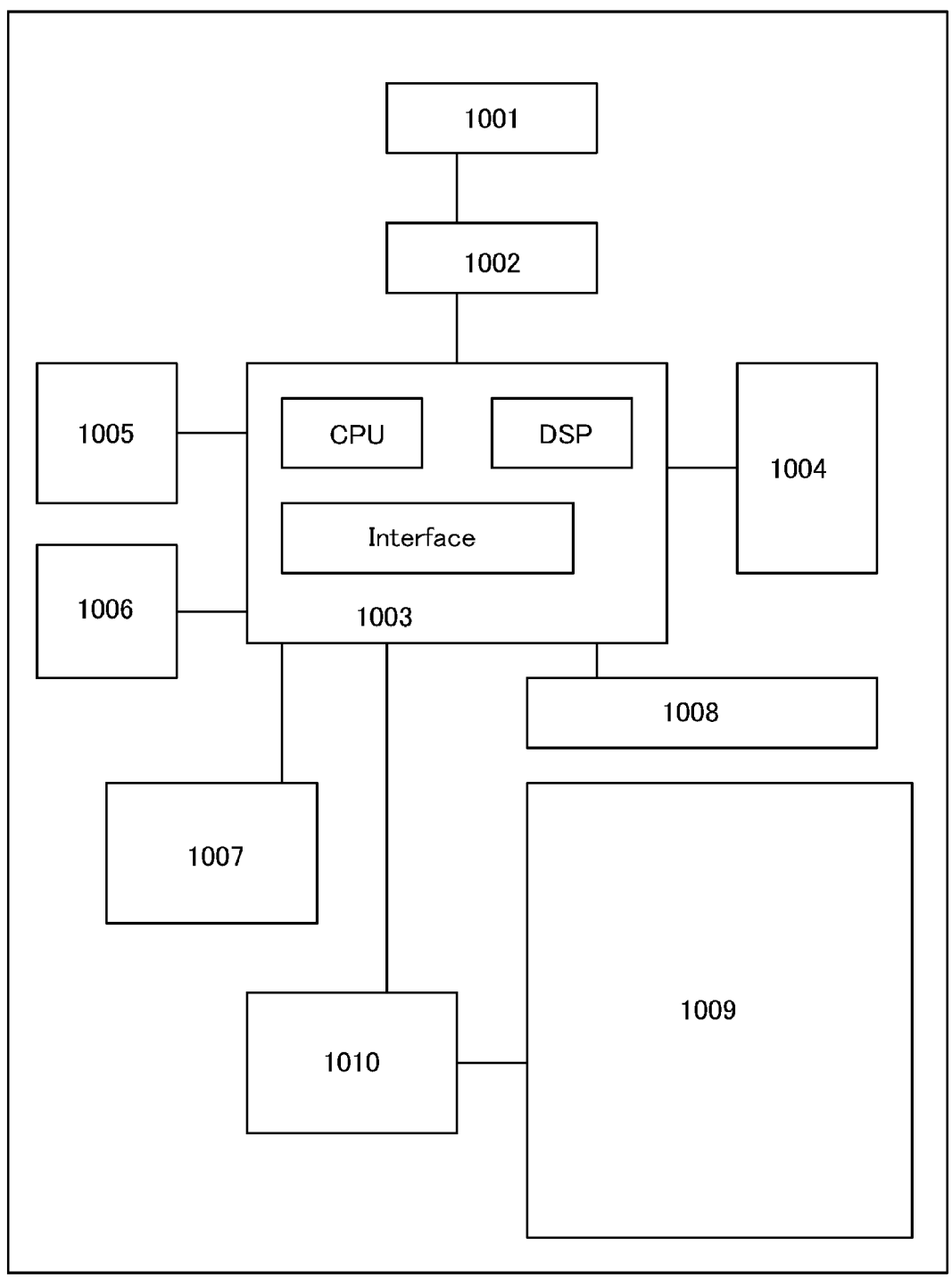
FIG. 11 is a block diagram illustrating one embodiment of a semiconductor device.

FIG. 11 is a block diagram of an e-book reader. FIG. 11 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in the above embodiment can be used for the memory circuit 1007 in FIG. 11. The memory circuit 1007 has a function of temporarily holding the contents of a book. For example, a user may use a highlight function. In some cases, a user wants to mark a specific part while reading on the e-book reader. Such a marking function is called a highlight function, by which characters are changed in color or type, underlined, or boldfaced, for example, so that a specific part is made to look distinct from the other part. The function makes it possible to store and hold data of a part specified by a user. In order to hold the data for a long time, the data may be copied to the flash memory 1004. Even in such a case, by employing the semiconductor device described in the above embodiment, writing and reading of data can be performed at high speed, data can be held for a long time, and power consumption can be sufficiently reduced.

As described above, the semiconductor device of the above embodiment is mounted on each of the portable devices described in this embodiment. Therefore, it is possible to obtain a portable device with low power consumption, which is capable of reading data at high speed and holding data for a long time.

This embodiment can be implemented in combination with any of the other embodiments as appropriate.

(Embodiment 5)

In this embodiment, an example of an electronic device including a display portion having a touch input function (touch panel), to which any of the transistors described in the above embodiments is applied, is described.

FIGS. 12A and 12B illustrate a tablet terminal that can be folded in two. In FIG. 12A, the tablet terminal is opened and includes a housing 9630, a display portion 9631a, a display portion 9631b, a switching button 9034, a power button 9035, a keyboard display button 9036, a touch panel region 9632a, a touch panel region 9632b, an operation key 9640, a hook 9033, a button 9038, and an operation key 9639 for the keyboard of the touch panel. Note that half of the display portion 9631a has only a display function and the other half has a touch panel function. However, one embodiment of the present invention is not limited to this structure, and the whole display portion 9631a may have a touch panel function. The display portion 9631b can be configured similarly.

The tablet terminal is closed in FIG. 12B. The tablet terminal includes the housing 9630, a solar cell 9633, a charge and discharge control circuit 9634, a battery 9635, and a DC-DC converter 9636. Note that FIG. 12B illustrates an example in which the charge and discharge control circuit 9634 includes the battery 9635 and the DC-DC converter 9636.

Since the tablet terminal can be folded in two, the housing 9630 can be closed when not in use. Thus, the display portion 9631a and the display portion 9631b can be protected, which makes it possible to provide a tablet terminal with excellence in durability and long-term use.

In addition, the tablet terminal illustrated in FIGS. 12A and 12B can have a function of displaying various kinds of information (e.g., a still image, a moving image, and a text image) on the display portion, a function of displaying a calendar, the date, the time, or the like on the display portion, a touch input function of operating or editing information displayed on the display portion by touch input, a function of controlling processing by various kinds of software (programs), and the like.

The solar cell 9633 provided on a surface of the tablet terminal can supply power to the touch panel, an image signal processing portion, or the like. Note that the solar cell 9633 can be provided on one or both surfaces of the housing 9630, so that the battery 9635 can be charged efficiently. When a lithium ion battery is used as the battery 9635, there is an advantage of downsizing or the like.

The structure and operation of the charge and discharge control circuit 9634 illustrated in FIG. 12B are described with reference to a block diagram of FIG. 12C. The solar cell 9633, the battery 9635, the DC-DC converter 9636, a converter 9637, switches SW1 to SW3, and a display portion 9631 are illustrated in FIG. 12C, and the battery 9635, the DC-DC converter 9636, the converter 9637, and the switches SW1 to SW3 correspond to the charge and discharge control circuit 9634 illustrated in FIG. 12B.

First, an example of operation in the case where power is generated by the solar cell 9633 using external light is described. The voltage of power generated by the solar cell 9633 is raised or lowered by the DC-DC converter 9636 to a voltage for charging the battery 9635. Then, when the power from the solar cell 9633 is used for the operation of the display portion 9631, the switch SW1 is turned on and the voltage of the power is raised or lowered by the converter 9637 to a voltage needed for the display portion 9631. In addition, when display on the display portion 9631 is not performed, the switch SW1 is turned off and the switch SW2 is turned on so that the battery 9635 is charged.

Note that, although the solar cell 9633 is described as an example of a means for charge, charge of the battery 9635 may be performed with another means. In addition, a combination of the solar cell 9633 and another means for charge may be used.

As described in the above embodiments, by using the transistor having better on-state characteristics and lower contact resistance for the display portion having a touch input function (touch panel), the electronic device illustrated in FIGS. 12A to 12C can be driven at higher speed and can have lower power consumption. Needless to say, one embodiment of the present invention is not necessarily the electronic device illustrated in FIGS. 12A to 12C as long as it includes any of the transistors described in the above embodiments in a display portion (touch panel).

This embodiment can be implemented in combination with any of the structures described in the other embodiments as appropriate.

This application is based on Japanese Patent Application serial no. 2011-217872 filed with the Japan Patent Office on Sep. 30, 2011, the entire contents of which are hereby incorporated by reference.

What is claimed is:

1. A semiconductor device comprising:
   a first insulating layer having a first opening and a second opening;
   a first conductive layer in the first opening;
   a second conductive layer in the second opening;
   a third conductive layer in contact with a top surface of the first conductive layer;
   a fourth conductive layer in contact with a top surface of the second conductive layer;
   a first layer covering an end portion of the third conductive layer and being in contact with the top surface of the first conductive layer;
   a second layer covering an end portion of the fourth conductive layer and being in contact with the top surface of the second conductive layer;
   an oxide semiconductor layer over the third conductive layer, the fourth conductive layer, the first layer, and the second layer;
   a second insulating layer over the oxide semiconductor layer; and
   a fifth conductive layer over the second insulating layer and between the third conductive layer and the fourth conductive layer.

2. The semiconductor device according to claim 1, further comprising:
   a sixth conductive layer in contact with the top surface of the first conductive layer, wherein a third opening is provided between the third conductive layer and the sixth conductive layer; and
   a seventh conductive layer in contact with the top surface of the second conductive layer, wherein a fourth opening is provided between the fourth conductive layer and the seventh conductive layer,
   wherein the first layer is in contact with the top surface of the first conductive layer in the third opening, and
   wherein the second layer is in contact with the top surface of the second conductive layer in the fourth opening.

3. The semiconductor device according to claim 1,
   wherein the first layer is in contact with a top surface and a side surface of the third conductive layer, and
   wherein the second layer is in contact with a top surface and a side surface of the fourth conductive layer.

4. The semiconductor device according to claim 1,
   wherein the third conductive layer is thinner than the first layer, and
   wherein the fourth conductive layer is thinner than the second layer.

5. The semiconductor device according to claim 1, wherein each of a top surface of the first insulating layer, a top surface of the first conductive layer, and a top surface of the second conductive layer is provided on a same surface.

6. The semiconductor device according to claim 1, wherein the fifth conductive layer overlaps with the third conductive layer and the fourth conductive layer.

7. The semiconductor device according to claim 1, wherein the fifth conductive layer does not overlap with either the first layer or the second layer.

8. A semiconductor device comprising:
   a first insulating layer having a first opening and a second opening;
   a first conductive layer in the first opening;
   a second conductive layer in the second opening;
   a third conductive layer in contact with a top surface of the first conductive layer;
   a fourth conductive layer in contact with a top surface of the second conductive layer;
   a fifth conductive layer covering an end portion of the third conductive layer and being in contact with the top surface of the first conductive layer;
   a sixth conductive layer covering an end portion of the fourth conductive layer and being in contact with the top surface of the second conductive layer;
   an oxide semiconductor layer over the third conductive layer, the fourth conductive layer, the fifth conductive layer, and the sixth conductive layer;
   a second insulating layer over the oxide semiconductor layer; and
   a seventh conductive layer over the second insulating layer and between the third conductive layer and the fourth conductive layer.

9. The semiconductor device according to claim 8, further comprising:
   an eighth conductive layer in contact with the top surface of the first conductive layer, wherein a third opening is provided between the third conductive layer and the eighth conductive layer; and
   a ninth conductive layer in contact with the top surface of the second conductive layer, wherein a fourth opening is provided between the fourth conductive layer and the ninth conductive layer,
   wherein the fifth conductive layer is in contact with the top surface of the first conductive layer in the third opening, and
   wherein the sixth conductive layer is in contact with the top surface of the second conductive layer in the fourth opening.

10. The semiconductor device according to claim 8,
    wherein the fifth conductive layer is in contact with a top surface and a side surface of the third conductive layer, and
    wherein the sixth conductive layer is in contact with a top surface and a side surface of the fourth conductive layer.

11. The semiconductor device according to claim 8,
    wherein the third conductive layer is thinner than the fifth conductive layer, and
    wherein the fourth conductive layer is thinner than the sixth conductive layer.

12. The semiconductor device according to claim 8, wherein each of a top surface of the first insulating layer, a top surface of the first conductive layer, and a top surface of the second conductive layer is provided on a same surface.

13. The semiconductor device according to claim 8, wherein the seventh conductive layer overlaps with the third conductive layer and the fourth conductive layer.

14. The semiconductor device according to claim 8, wherein the seventh conductive layer does not overlap with either the fifth conductive layer or the sixth conductive layer.

* * * * *